(12) United States Patent
Wang et al.

(10) Patent No.: US 11,508,807 B2
(45) Date of Patent: Nov. 22, 2022

(54) SEMICONDUCTOR DEVICE HAVING NANOSHEET TRANSISTOR AND METHODS OF FABRICATION THEREOF

(71) Applicant: TAIWAN SEMICONDUCTOR MANUFACTURING COMPANY, LTD., Hsinchu (TW)

(72) Inventors: Chih-Ching Wang, Kinmen County (TW); Wen-Hsing Hsieh, Hsinchu (TW); Jon-Hsu Ho, New Taipei (TW); Wen-Yuan Chen, Taoyuan County (TW); Chia-Ying Su, Hsinchu (TW); Chung-Wei Wu, Hsinchu County (TW); Zhiqiang Wu, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 25 days.

(21) Appl. No.: 17/104,666

(22) Filed: Nov. 25, 2020

(65) Prior Publication Data
US 2022/0165842 A1    May 26, 2022

(51) Int. Cl.
| *H01L 29/06* | (2006.01) |
| *H01L 29/10* | (2006.01) |
| *H01L 29/16* | (2006.01) |
| *H01L 29/423* | (2006.01) |
| *H01L 29/08* | (2006.01) |

(52) U.S. Cl.
CPC ...... *H01L 29/0615* (2013.01); *H01L 29/0847* (2013.01); *H01L 29/1033* (2013.01); *H01L 29/1608* (2013.01); *H01L 29/42376* (2013.01)

(58) Field of Classification Search
None
See application file for complete search history.

(56) References Cited

U.S. PATENT DOCUMENTS

| | | | |
|---|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |

(Continued)

*Primary Examiner* — Ali Naraghi
(74) *Attorney, Agent, or Firm* — NZ Carr Law Office, PLLC

(57) ABSTRACT

Embodiments relate to a semiconductor device structure including a first channel layer having a first surface and a second surface, a second channel layer having a first surface and a second surface, and the first and second channel layers are formed of a first material. The structure also includes a first dopant suppression layer in contact with the second surface of the first channel layer, and a second dopant suppression layer parallel to the first dopant suppression layer. The second dopant suppression layer is in contact with the first surface of the second channel layer, and the first and second dopant suppression layers each comprises carbon or fluorine. The structure further includes a gate dielectric layer in contact with the first and second dopant suppression layers and the first surface of the first channel layer, and a gate electrode layer disposed on the gate dielectric layer.

20 Claims, 22 Drawing Sheets

(56) References Cited

U.S. PATENT DOCUMENTS

| | | |
|---|---|---|
| 9,536,738 B2 | 1/2017 | Huang et al. |
| 9,576,814 B2 | 2/2017 | Wu et al. |
| 9,608,116 B2 | 3/2017 | Ching et al. |
| 9,954,058 B1 * | 4/2018 | Mochizuki ........ H01L 29/42392 |
| 10,032,867 B1 * | 7/2018 | Yeung ................ H01L 29/0649 |
| 10,170,638 B1 * | 1/2019 | Reznicek .......... H01L 29/78618 |
| 2019/0326396 A1 * | 10/2019 | Cheng ............... H01L 29/66545 |
| 2021/0066292 A1 * | 3/2021 | Xiao ................. H01L 21/02532 |
| 2021/0296315 A1 * | 9/2021 | Lilak ............... H01L 21/823871 |

* cited by examiner

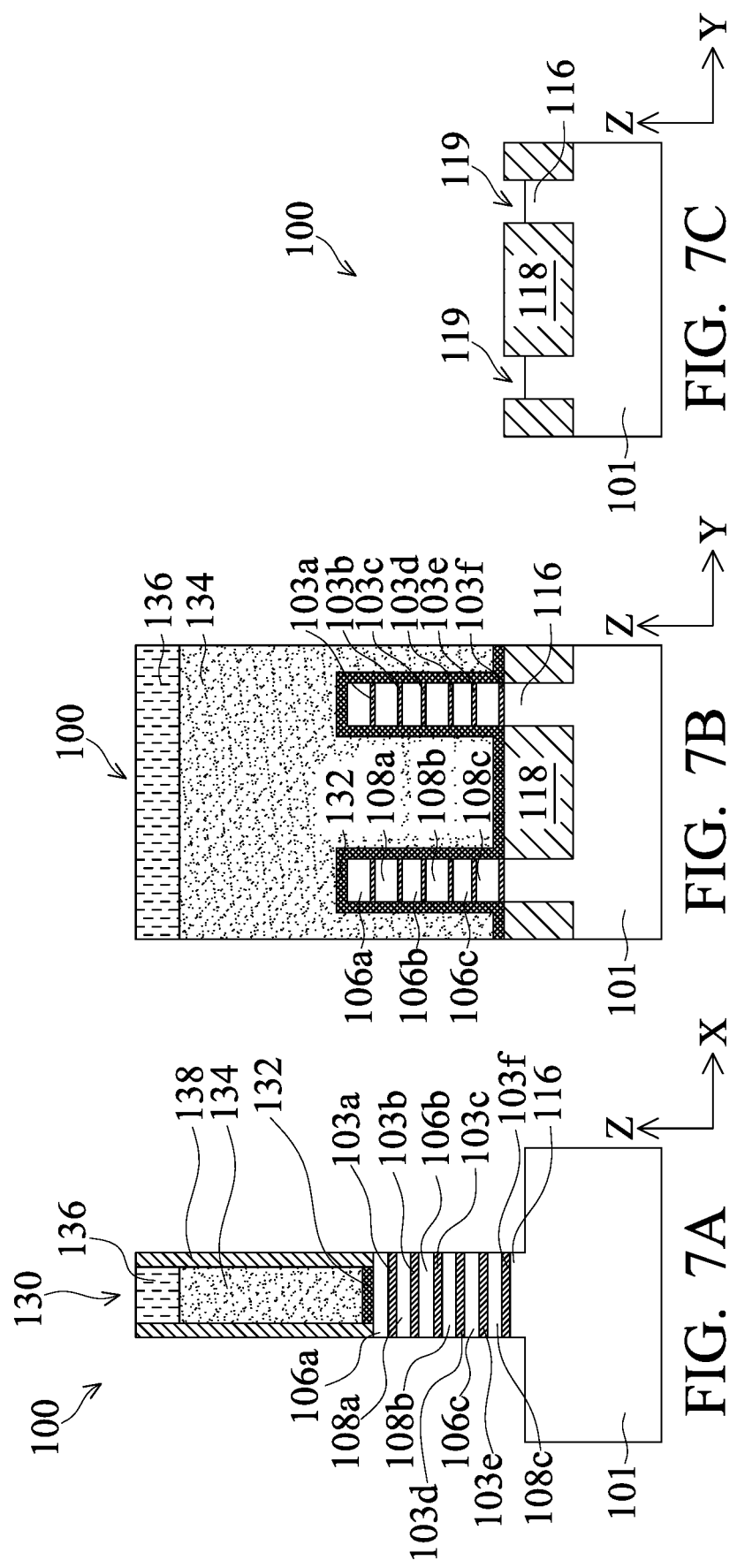

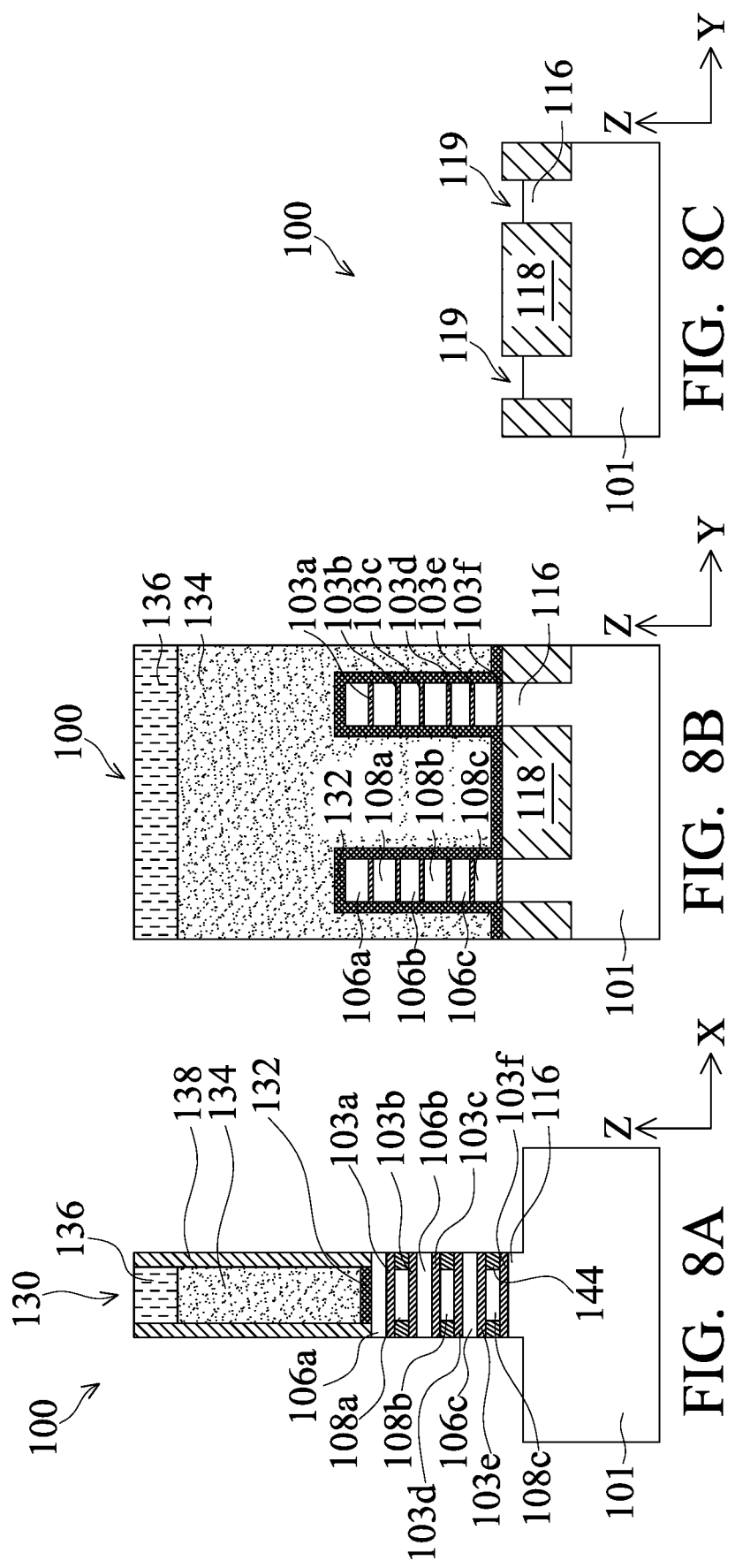

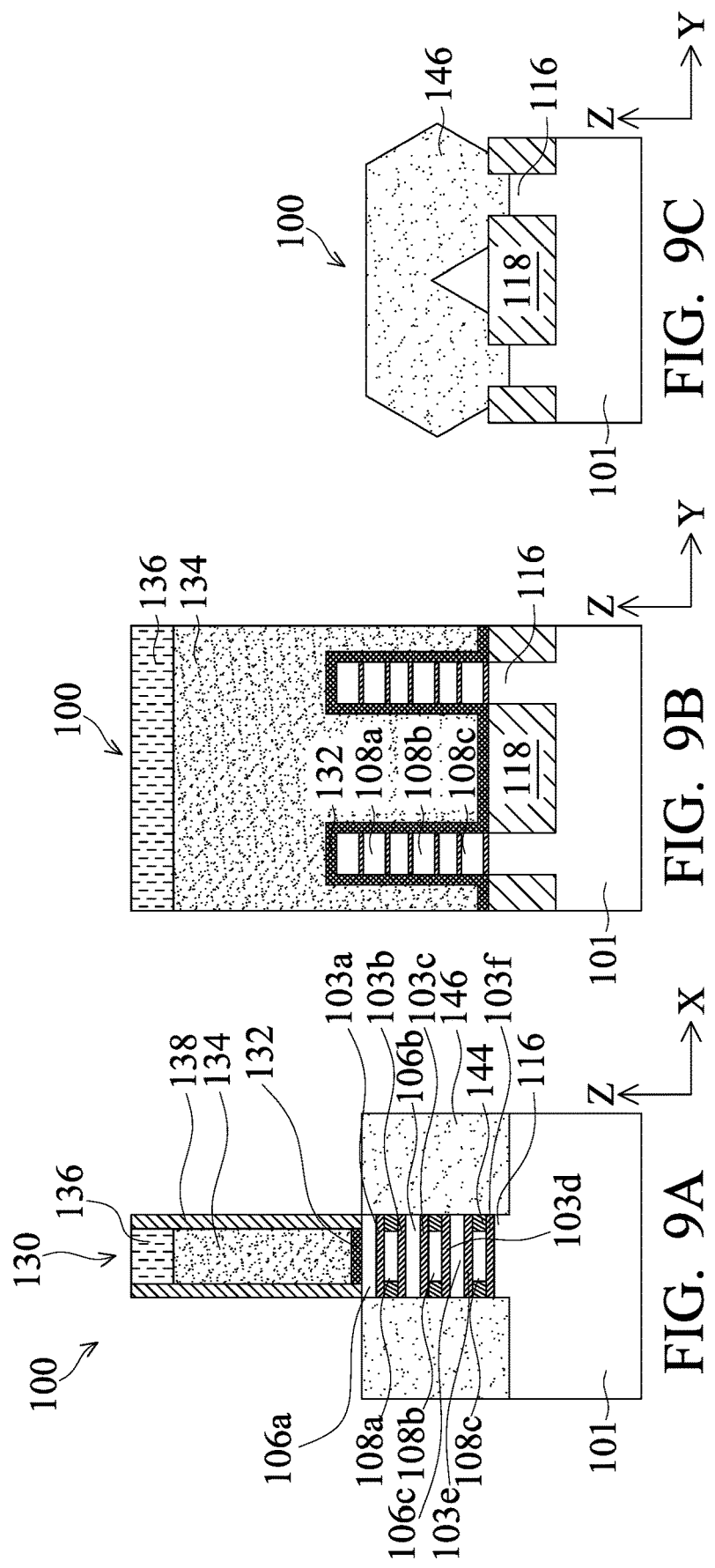

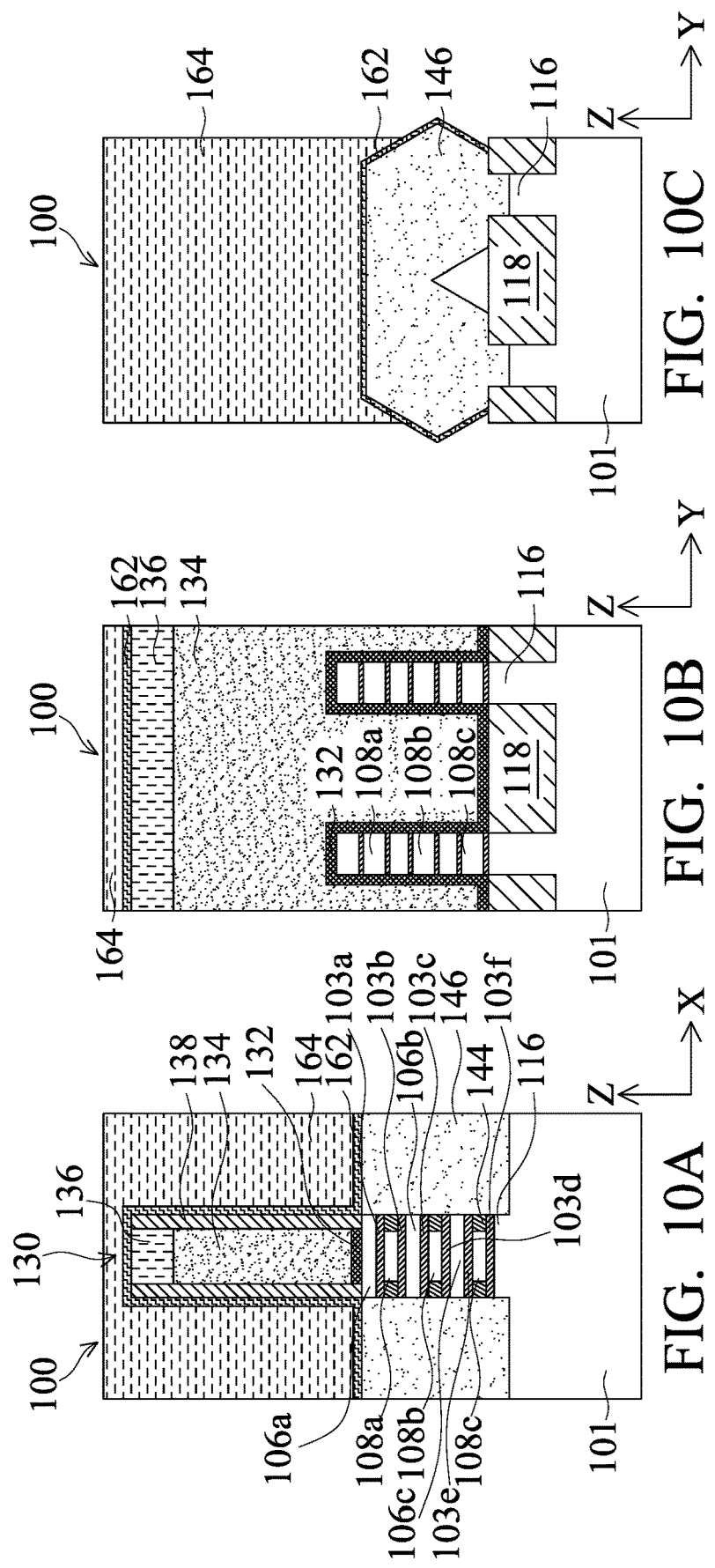

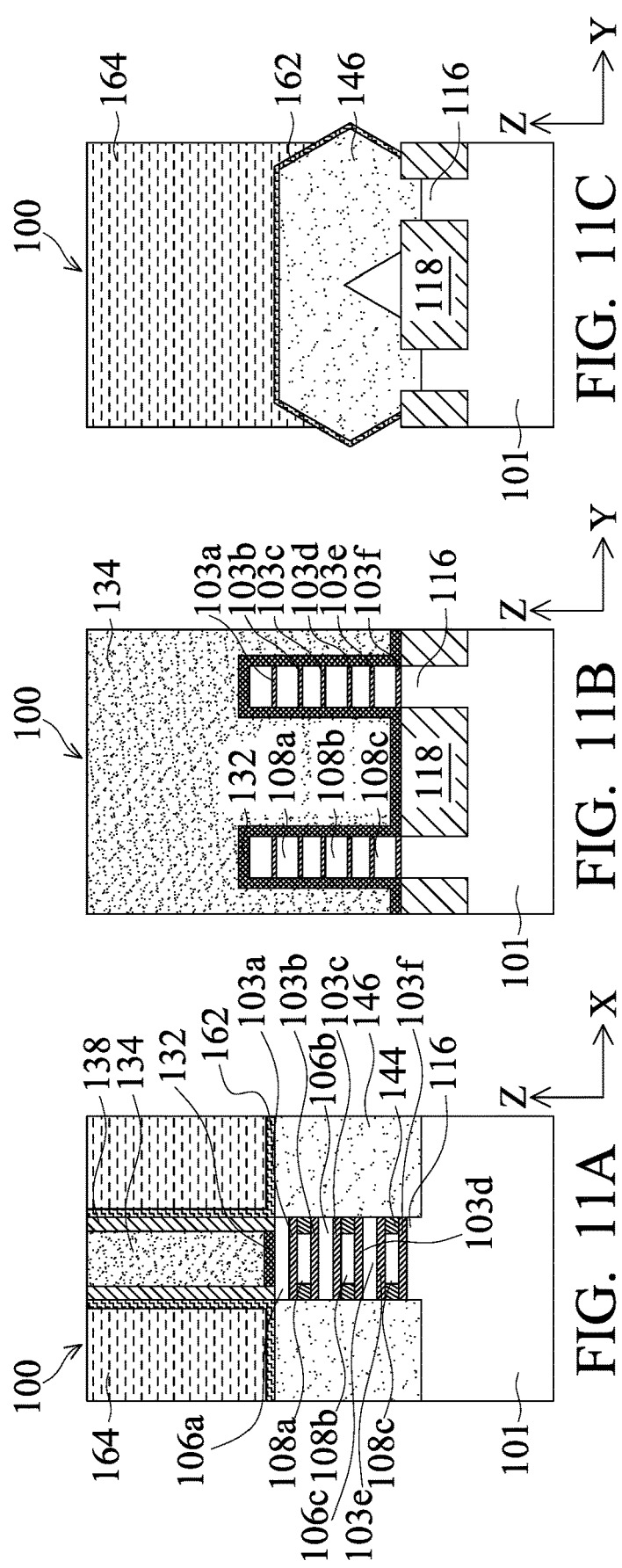

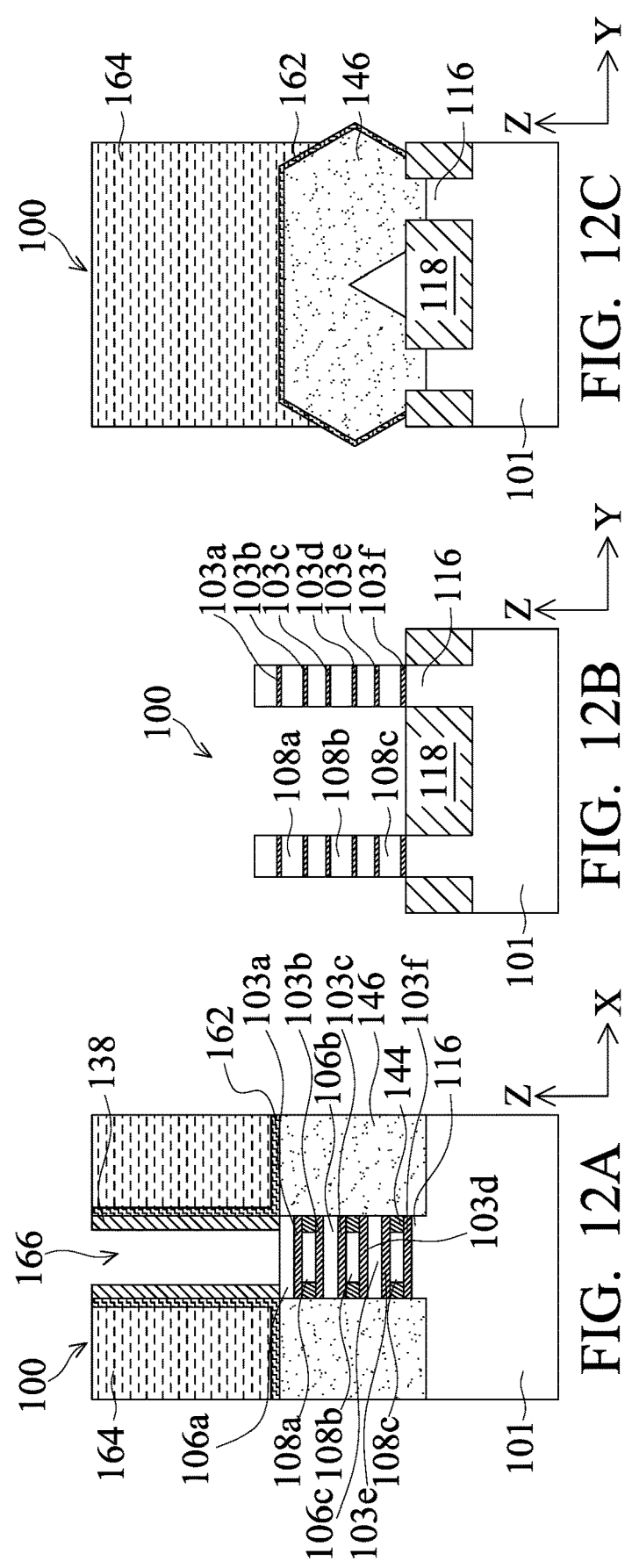

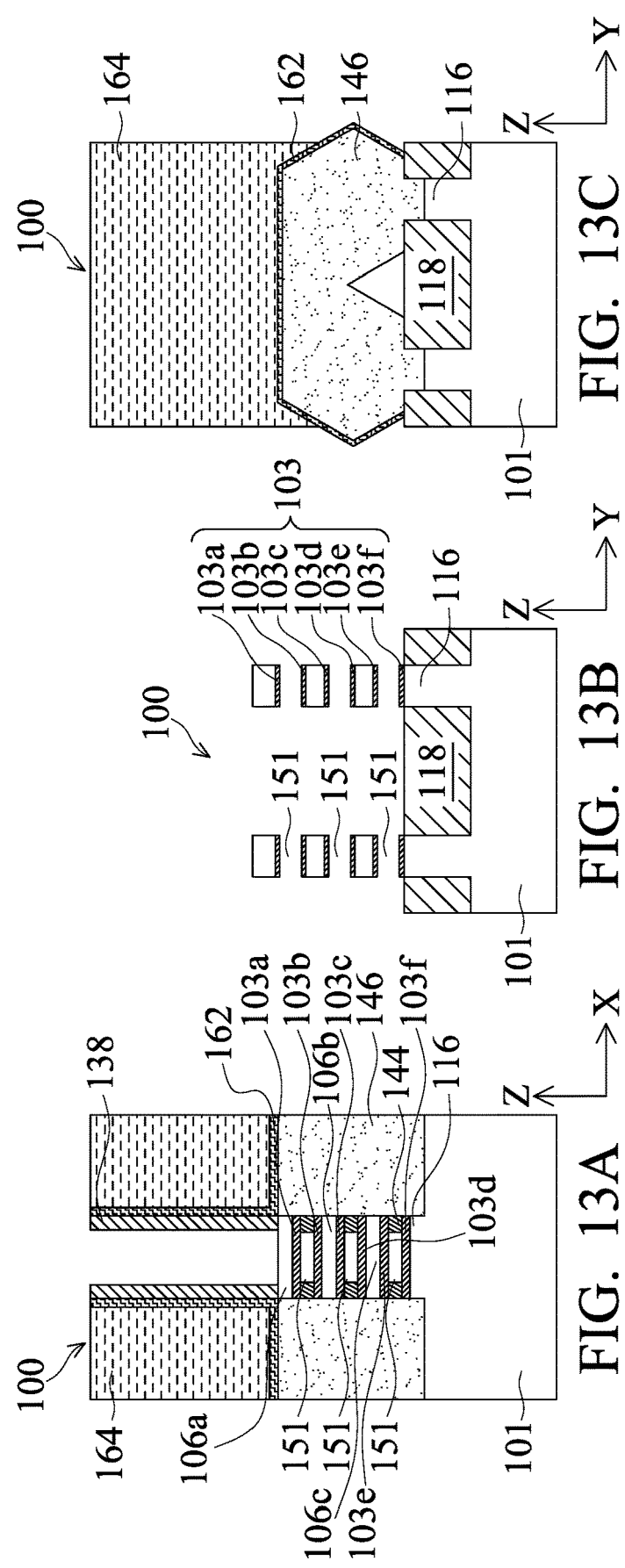

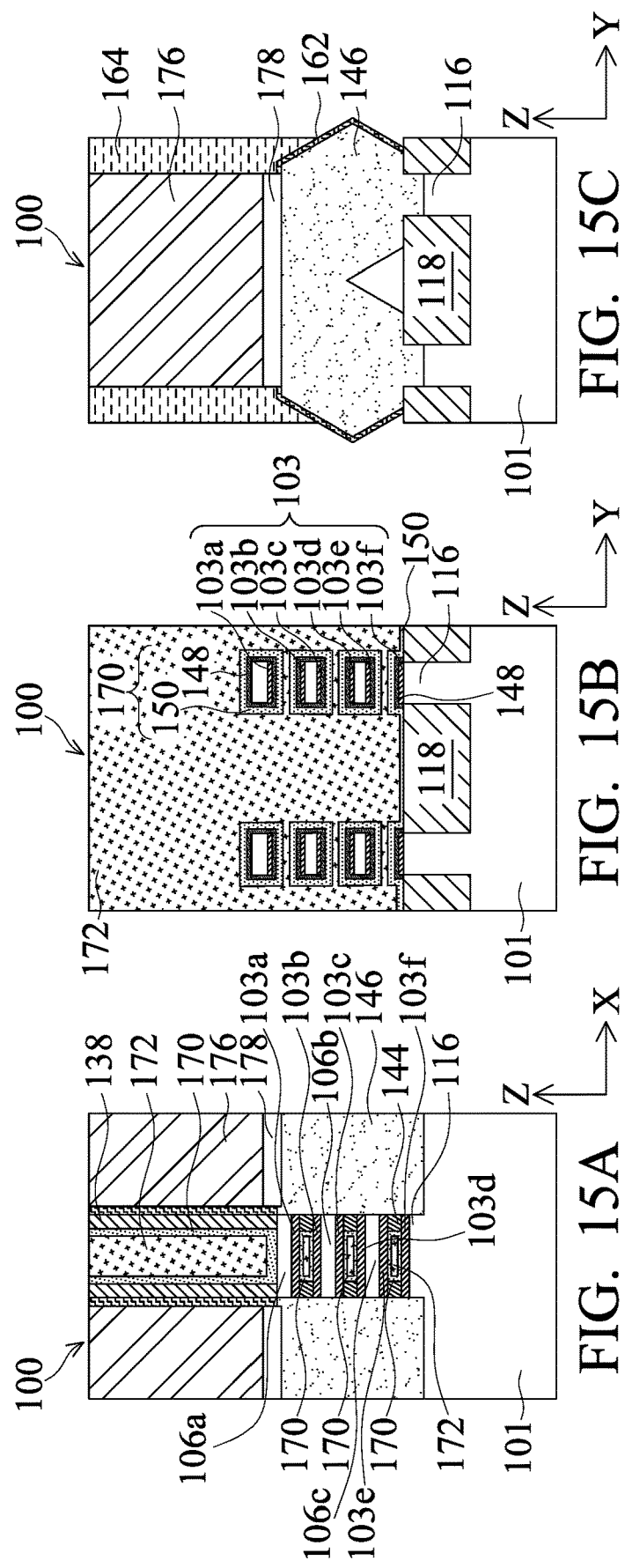

(Alternative Embodiment)

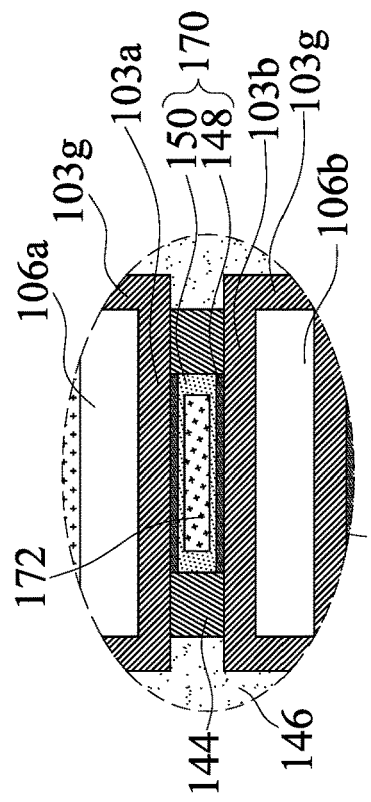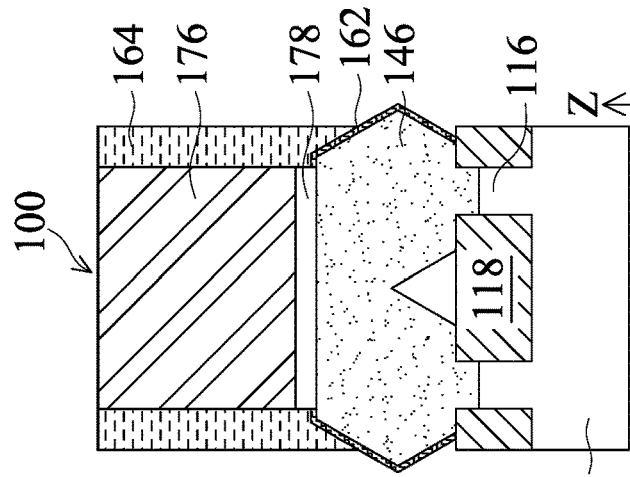

(Alternative Embodiment)

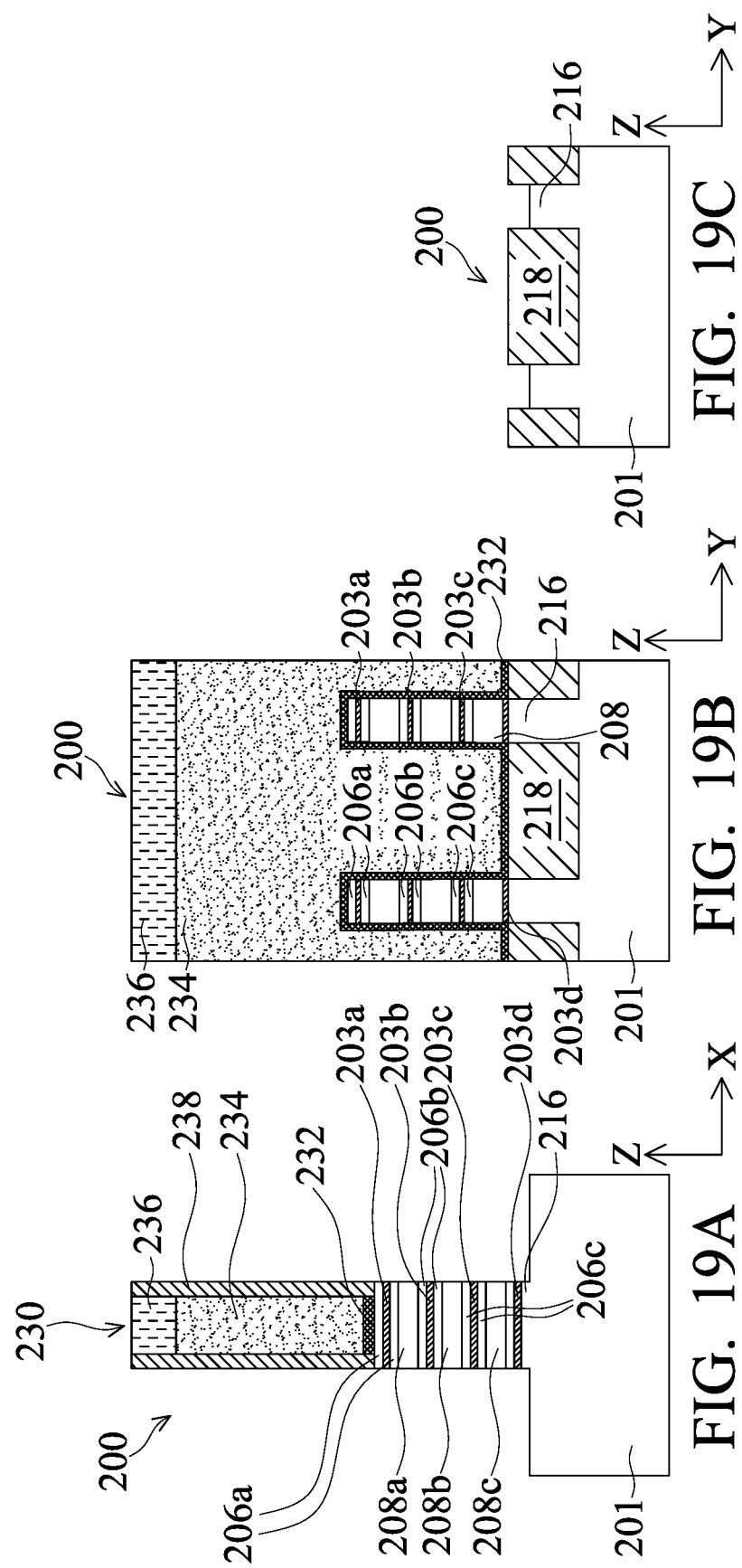

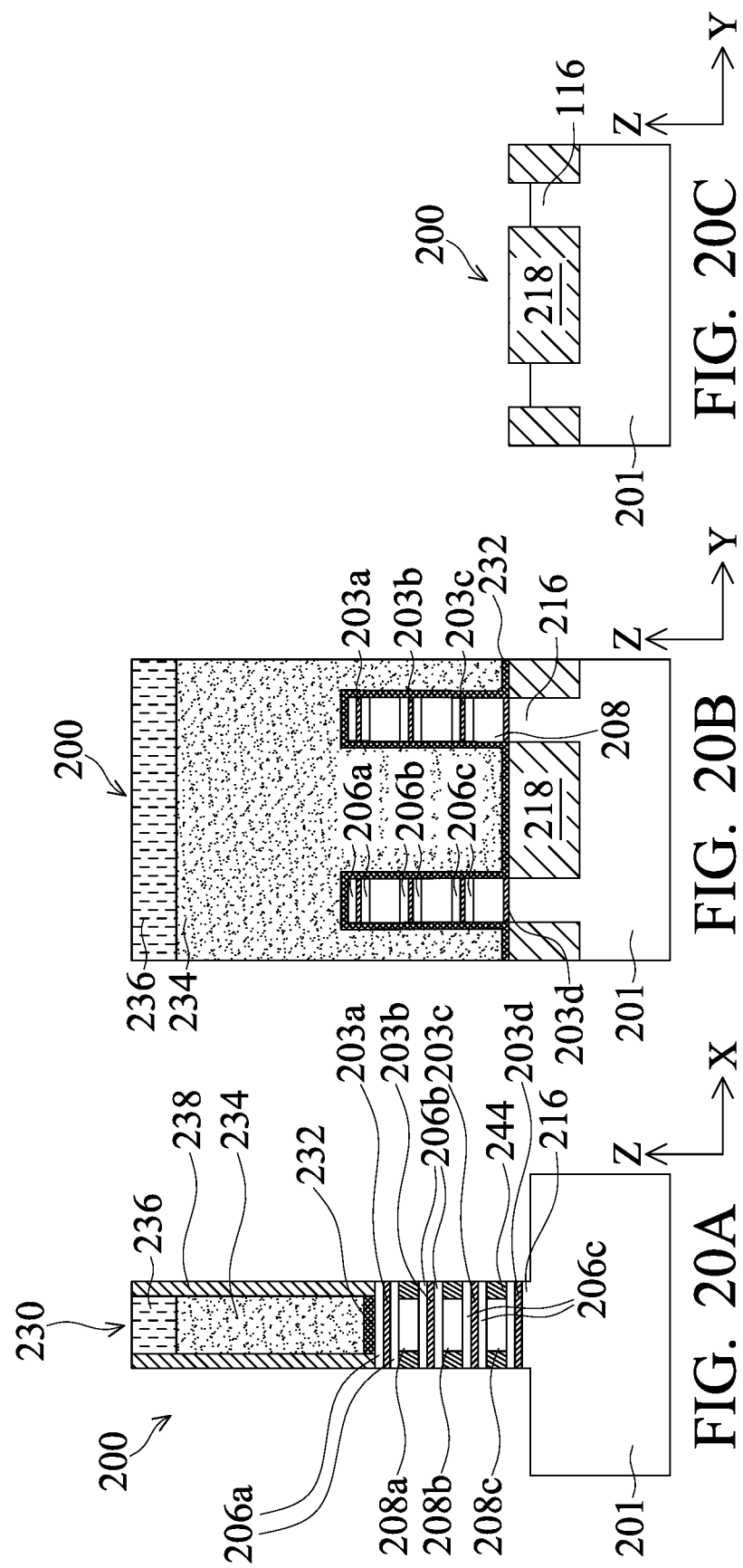

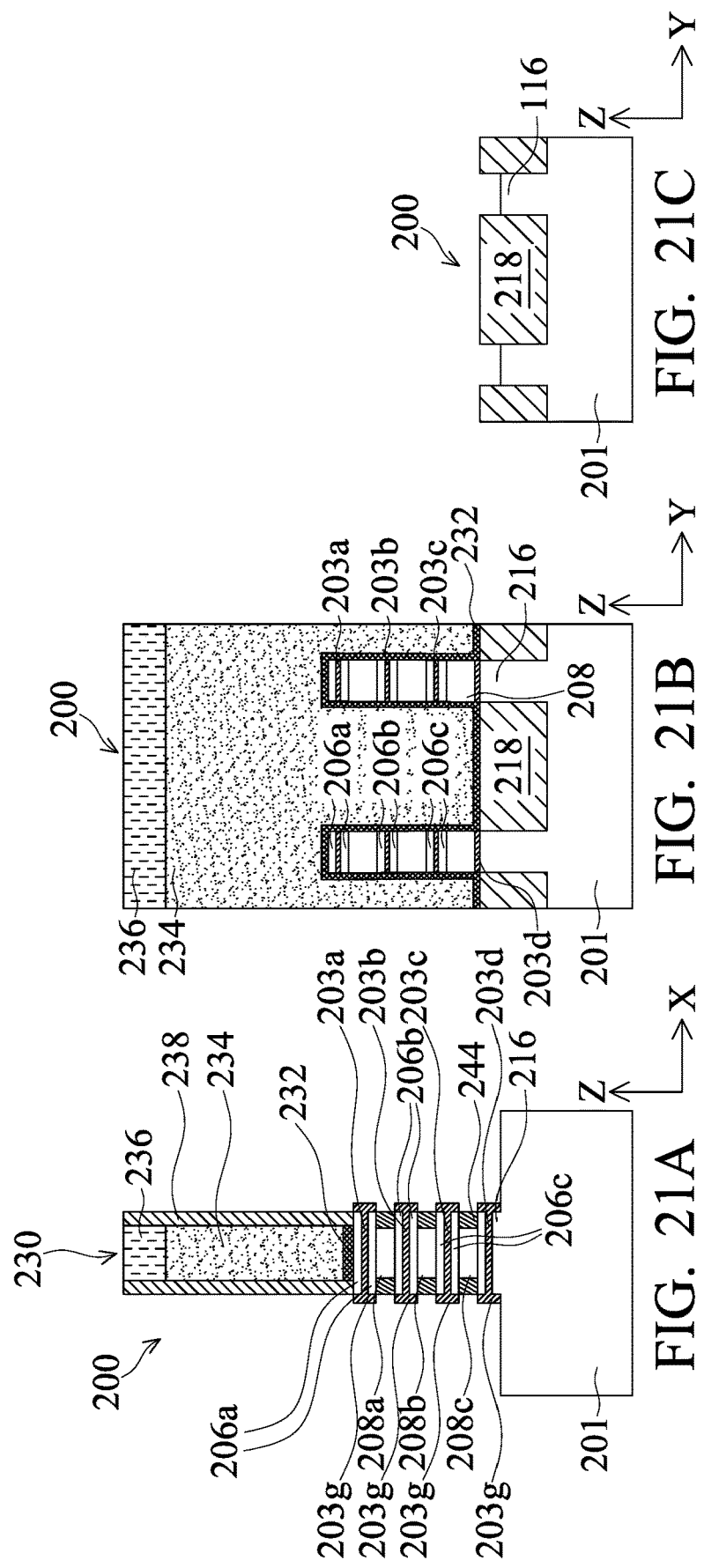

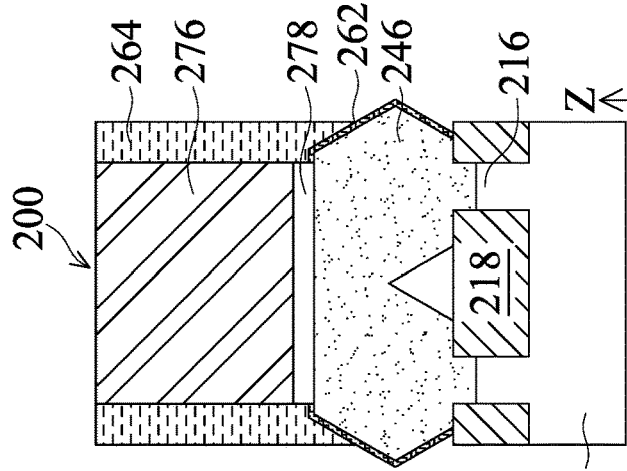
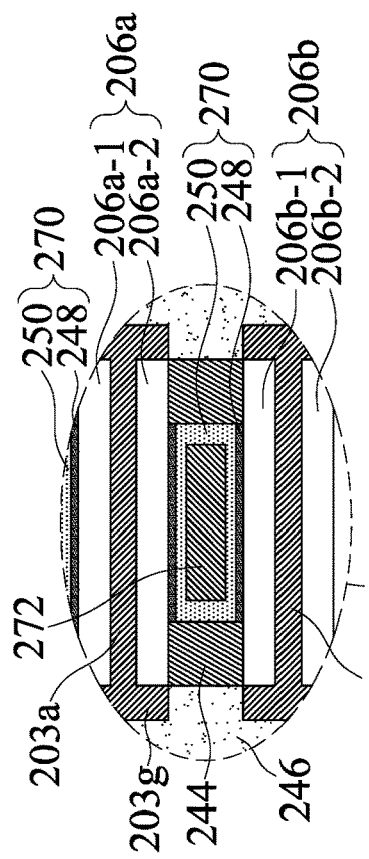
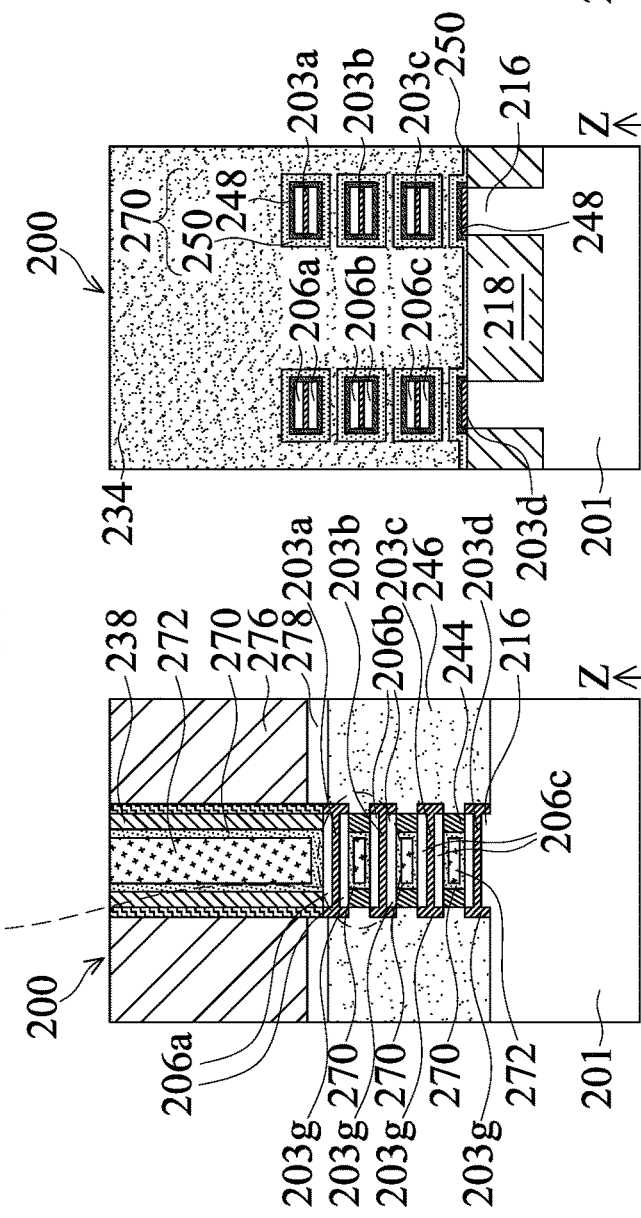
FIG. 22A  FIG. 22B  FIG. 22C  FIG. 22D

SEMICONDUCTOR DEVICE HAVING NANOSHEET TRANSISTOR AND METHODS OF FABRICATION THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge. For example, transistors using nanowire channels have been proposed to improve carrier mobility and drive current in a device. N-type or p-type dopants are often used in highly doped source and drain regions to help reduce parasitic resistance of the transistors. As device size reduces, such dopants may propagate and result in poor mobility due to impurity scattering.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A, 7B, 7C to 14A, 14B, 14C are cross-sectional side views of various stages of manufacturing the semiconductor device structure taken along line A-A, line B-B, and line C-C of FIG. 6, respectively, in accordance with some embodiments.

FIGS. 15A, 15B, and 15C are cross-sectional side views of one of various stages of manufacturing the semiconductor device structure taken along line A-A, line B-B, and line C-C of FIG. 6, respectively, in accordance with some embodiments.

FIGS. 17A, 17B, 17C are cross-sectional side views of the semiconductor device structure of FIG. 16A after the processes discussed above with respect to 9A 9C to 15A 15C are performed on the semiconductor device structure; FIG. 17D illustrates an enlarged view of a portion of the nanosheet channels according to some embodiments of the present disclosure.

FIGS. 19A, 19B, 19C are cross-sectional side views of one of various stages of manufacturing the semiconductor device structure of FIG. 18 after the processes discussed above in FIGS. 2-6 are performed on the semiconductor device structure.

FIGS. 20A, 20B, and 20C are cross-sectional side views of one of various stages of manufacturing the semiconductor device structure taken along the first line (e.g., line A-A of FIG. 6), the second line (e.g., line B-B of FIG. 6), and the third line (e.g., line C-C of FIG. 6), respectively, in accordance with some embodiments.

FIGS. 21A, 21B, and 21C are cross-sectional side views of one of various stages of manufacturing the semiconductor device structure taken along the first line (e.g., line A-A of FIG. 6), the second line (e.g., line B-B of FIG. 6), and the third line (e.g., line C-C of FIG. 6), respectively, in accordance with some embodiments.

FIGS. 22A-22C illustrate cross-sectional side views of the semiconductor device structure of FIG. 21A after the processes discussed above with respect to 9A-9C to 15A-15C are performed on the semiconductor device structure.

FIG. 22D is an enlarged view of a portion of the nanosheet channels of the semiconductor device structure according to some embodiments.

DETAILED DESCRIPTION

Figure 1:
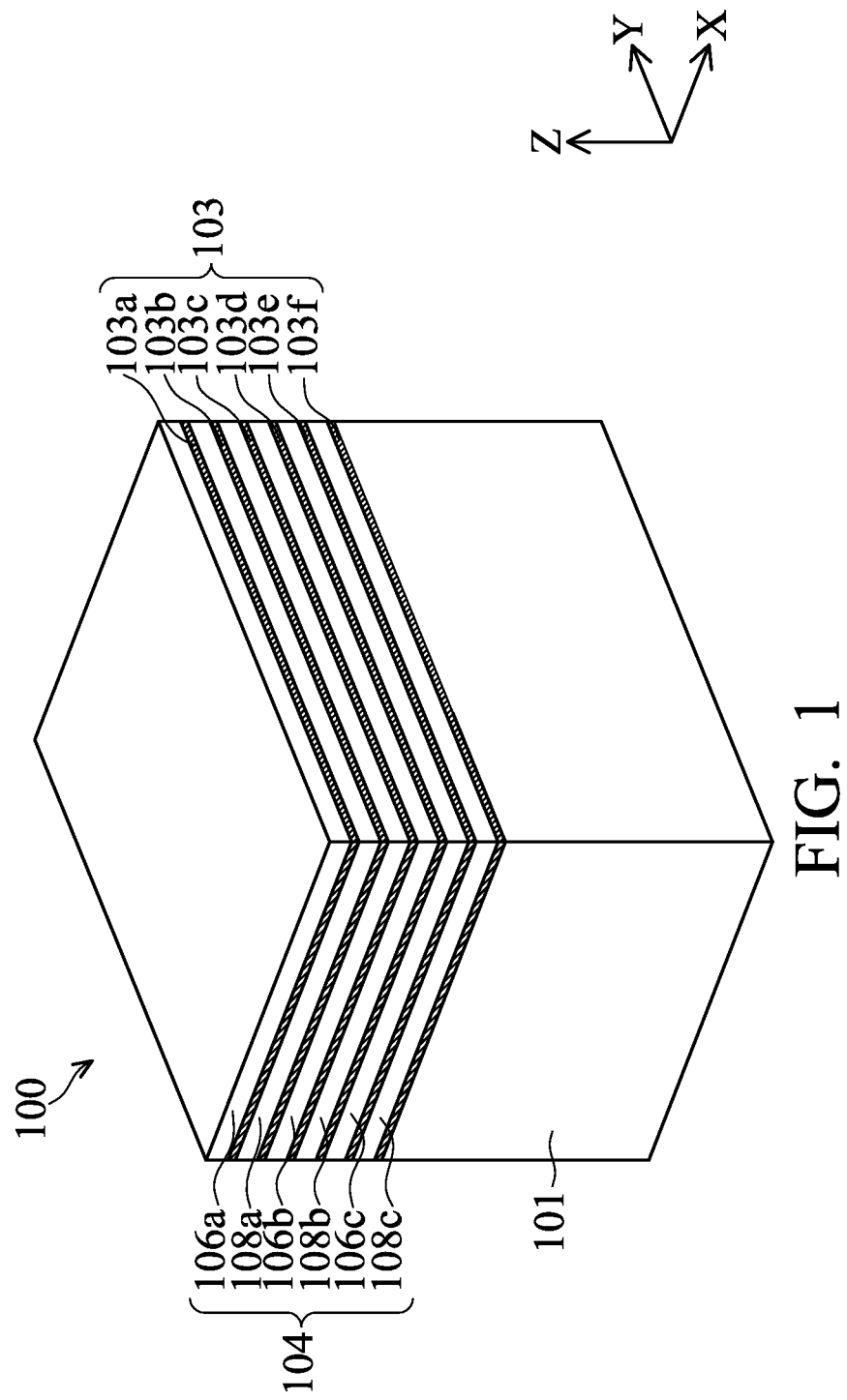
FIGS. 1-6 are perspective views of various stages of manufacturing a semiconductor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure relate to gate all around (GAA) transistors, such as nanosheet FETs, which has a stack of semiconductor layers including first and second semiconductor layers alternatingly formed over a substrate. The first semiconductor layers form nanosheet channel(s) of the transistors. Portions of the second semiconductor layers are removed so that the first semiconductor layers in the nanosheet channels are wrapped around by a gate electrode for better gate control. According to embodiments of the present disclosure, exposed surfaces of the first semiconductor layers are covered by a dopant suppression layer to prevent dopant diffusion from source/drain regions into the nanosheet channels.

While the embodiments of this disclosure are discussed with respect to nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-22D show exemplary processes for manufacturing a semiconductor device structure 100 according to embodiments of the present disclosure. It is understood that additional operations can be provided before, during, and after processes shown by FIGS. 1-22D, and some of the operations described below can be replaced or eliminated, for additional embodiments of the method. The order of the operations/processes is not limiting and may be interchangeable.

FIGS. 1-6 are perspective views of various stages of manufacturing a semiconductor device structure 100 in accordance with some embodiments. As shown in FIG. 1, a semiconductor device structure 100 includes a stack of layers 104 formed over a front side of a substrate 101. The substrate 101 may be a semiconductor substrate. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type conductivity). Depending on circuit design, the dopants may be, for example boron for an n-type field effect transistors (NFET) and phosphorus for a p-type field effect transistors (PFET).

The stack of layers 104 includes alternating semiconductor layers made of different materials to facilitate formation of nanosheet channels in a multi-gate device, such as nanosheet channel FETs. In some embodiments, the stack of layers 104 includes first semiconductor layers 106 (106a-106c) and second semiconductor layers 108 (108a-108c). In some embodiments, the stack of layers 104 includes alternating first and second semiconductor layers 106, 108. The first semiconductor layers 106 are aligned with the second semiconductor layers 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. In some cases, the SiGe in the first or second semiconductor layers 106, 108 can have a germanium composition percentage between about 10% and about 50%. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. The semiconductor device structure 100 may include a nanosheet transistor. The nanosheet transistors may be referred to as nanowire transistors, gate-all-around (GAA) transistors, multi-bridge channel (MBC) transistors, or any transistors having the gate electrode surrounding the channels.

The stack of layers 104 also includes a plurality of dopant suppression layers 103 (103a-f) formed over the front side of the substrate 101. It has been observed that dopants such as phosphorus or arsenic may diffuse from subsequently formed source and drain (S/D) regions into the nanosheet channels (e.g., first semiconductor layers 106) along the heterojunction (e.g., the interface of Si/SiGe layers). Diffusion of dopants into the nanosheet channels results in leakage current at or near the heterojunction, thereby degrading the performance of the semiconductor device structure 100. The dopant suppression layers 103 (e.g., dopant suppression layers 103b, 103c as shown below in FIGS. 14A, 14B and 14D) cover the major surfaces of the first semiconductor layers 106 and thus block or minimize diffusion of dopants into the nanosheet channels from the (S/D) regions.

In some embodiments, one or more dopant suppression layers 103 are disposed between the first semiconductor layer 106 and the second semiconductor layer 108. In the embodiment shown in FIG. 1, the second semiconductor layer 108 is sandwiched between the dopant suppression layers 103. In one exemplary aspect, for example, the dopant suppression layer 103a is in contact with the first semiconductor layer 106a and the second semiconductor layer 108a; the dopant suppression layer 103b is in contact with the second semiconductor layer 108a and the first semiconductor layer 106b; the dopant suppression layer 103c is in contact with the first semiconductor layer 106b and the second semiconductor layer 108b; the dopant suppression layer 103d is in contact with the second semiconductor layer 108b and the first semiconductor layer 106c, the dopant suppression layer 103e is in contact with the first semiconductor layer 106c and the second semiconductor layer 108c; and the dopant suppression layer 103f is in contact with the second semiconductor layer 108c and the substrate 101.

In various embodiments, the dopant suppression layers 103 may be or include a silicon-containing layer or a carbon-containing layer. Exemplary materials may include, but are not limited to, silicon carbide, carbon doped silicon, silicon carbonitride (nitride-bonded silicon carbide or silicon carbide doped with nitrogen), or any suitable material that contains at least the elements silicon and carbon. Carbon doped silicon or the like is advantageous for minimizing dopant diffusion because carbon tends to trap silicon vacancies, which in turn reduces the silicon interstitial concentrations available for bonding with dopants (e.g., boron or phosphorous) in silicon-based materials. In addition, since the carbon doped silicon have greater lattice constant than that of the silicon-based first semiconductor layers 106, the dopant suppression layers 103 can produce tensile strained nanosheet channels (e.g., n-channel FET), which in turn enhances electron mobility of the semiconductor structure device 100.

In one embodiment, the dopant suppression layer 103 is silicon carbide. In another embodiment, the dopant suppression layer 103 is carbon doped silicon. In either case, the dopant suppression layers 103 may have a carbon atomic concentration (at. %) in a range between about 0.1 at. % and about 3 at. %. If the carbon concentration exceeds over 3 at. %, defects such as dislocations may occur at or near the interface between the dopant suppression layers 103 and the layers the dopant suppression layers 103 abutting against thereto (e.g., first and second semiconductor layers 106, 108) due to lattice mismatch. On the other hand, if the carbon concentration is less than 0.1 at. %, the dopant suppression layers 103 may not be sufficient to trap silicon vacancies and reduce the silicon interstitial concentrations available for bonding with dopants. As a result, the dopant suppression layers 103 may fail to block or minimize unwanted dopant diffusion coming from the source and drain regions.

In some embodiments, the dopant suppression layers 103 may be or include arsenic doped silicon carbide, arsenic doped silicon, or any suitable material containing at least the elements silicon and arsenic, which may contain one or more additional elements, such as carbon. In one embodiment, the dopant suppression layer 103 is arsenic doped silicon carbide. In another embodiment, the dopant suppression layer 103 is arsenic doped silicon. In either case, the dopant suppression layers 103 may be doped with arsenic at a level of about $1 \times 10^{18}$ atoms per cubic centimeter (atoms/cm$^3$) or less.

In some embodiments, the dopant suppression layer 103 may be or include fluorine doped silicon. In one embodiment, the dopant suppression layer 103 is silicon fluoride or any suitable material containing at least the elements silicon and fluorine. In another embodiment, the dopant suppression layer 103 is fluorine-rich silicon. In such a case, the dopant suppression layers 103 may be doped with fluorine at a level of about $1 \times 10^{18}$ atoms per cubic centimeter (atoms/cm$^3$) or less.

The first and second semiconductor layers 106, 108 are formed by any suitable deposition process, such as epitaxy. By way of example, epitaxial growth of the layers of the stack of layers 104 may be performed by a molecular beam epitaxy (MBE) process, a metalorganic chemical vapor deposition (MOCVD) process, and/or other suitable epitaxial growth processes. The dopant suppression layers 103 may be formed by chemical vapor deposition (CVD) process, physical vapor deposition (PVD), or any suitable deposition process.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. Each dopant suppression layer 103 may have a thickness of about 3 nm or less, for example about 0.1 nm to about 1.5 nm. While three first semiconductor layers 106 and three second semiconductor layers 108 are illustrated in FIG. 1, any number of the first and second semiconductor layers 106, 108 can be formed in the stack of layers 104, and the number of layers depending on the predetermined number of channels for the semiconductor device structure 100.

Figure 2:
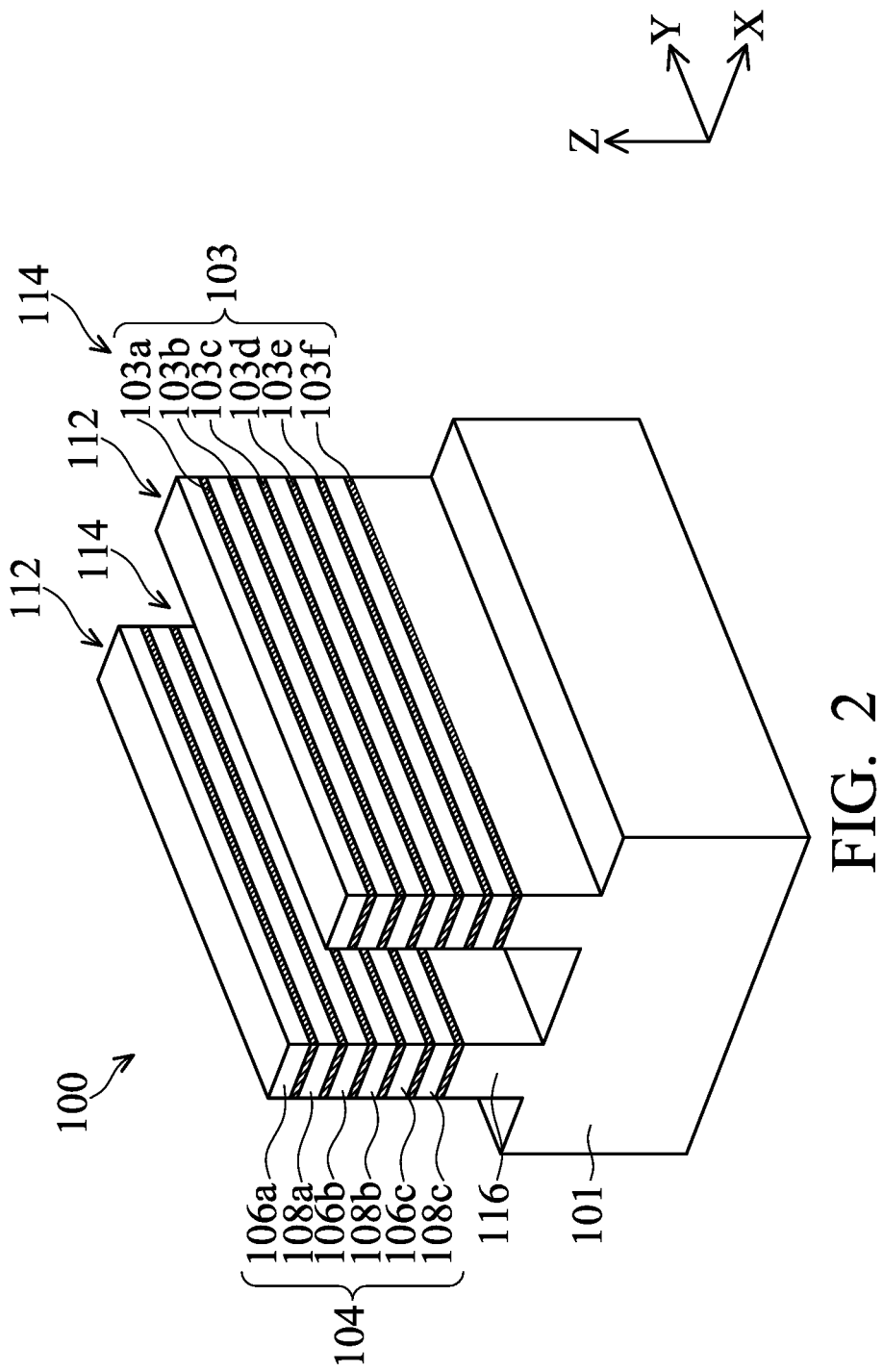

In FIG. 2, fin structures 112 are formed from the stack of layers 104. Each fin structure 112 has an upper portion including the semiconductor layers 106, 108, the dopant suppression layers 103, and a well portion 116 formed from the substrate 101. The fin structures 112 may be formed by patterning a hard mask layer (not shown) formed on the stack of layers 104 using multi-patterning operations including photo-lithography and etching processes. The etching process can include dry etching, wet etching, reactive ion etching (RIE), and/or other suitable processes. The photo-lithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 in unprotected regions through the hard mask layer, through the stack of layers 104, and into the substrate 101, thereby leaving the plurality of extending fin structures 112. The trenches 114 extend along the X direction. The trenches 114 may be etched using a dry etch (e.g., RIE), a wet etch, and/or combination thereof.

Figure 3:
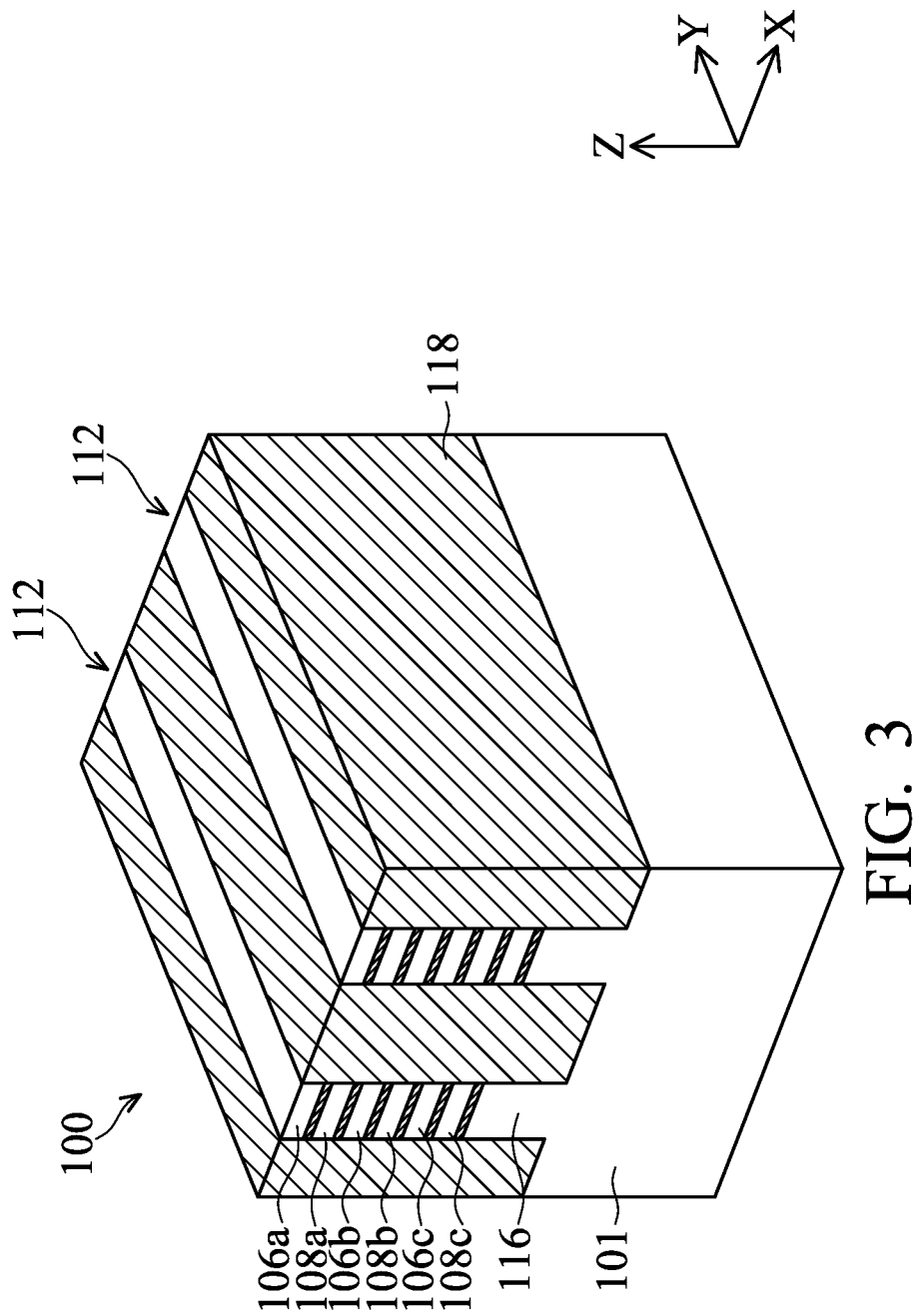

In FIG. 3, after the fin structures 112 are formed, an insulating material 118 is formed on the substrate 101. The insulating material 118 fills the trenches 114 between neighboring fin structures 112 until the fin structures 112 are embedded in the insulating material 118. Then, a planarization operation, such as a chemical mechanical polishing (CMP) method and/or an etch-back method, is performed such that the top of the fin structures 112 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 4:
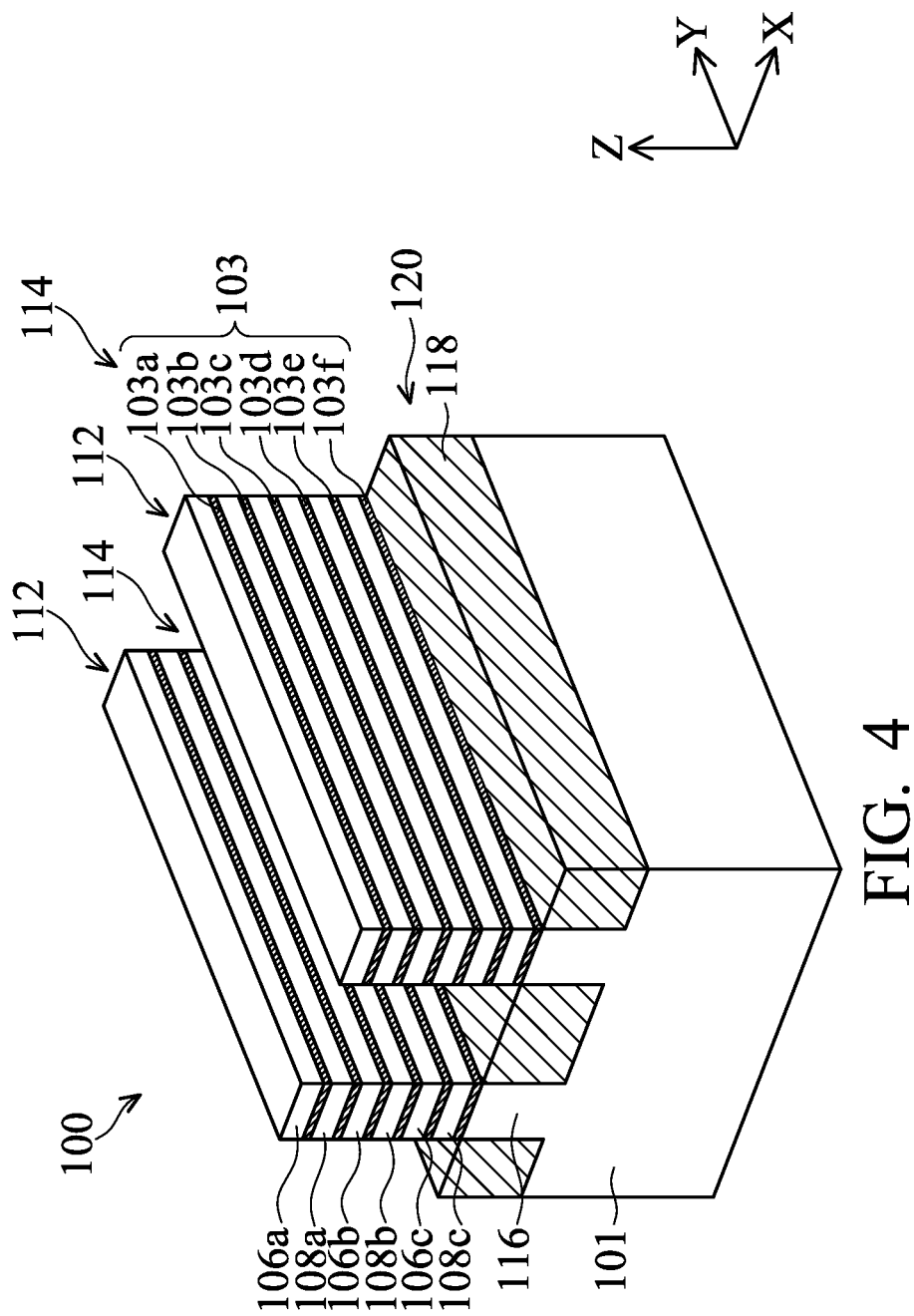

In FIG. 4, the insulating material 118 is recessed to form an isolation region 120. The recess of the insulating material 118 exposes portions of the fin structures 112, such as the stack of layers 104. The recess of the insulating material 118 reveals the trenches 114 between the neighboring fin structures 112. The isolation region 120 may be formed using a suitable process, such as a dry etching process, a wet etching process, or a combination thereof. A top surface of the insulating material 118 may be level with or below a surface of the dopant suppression layer 103*f* in contact with the well portion 116 formed from the substrate 101.

Figure 5:
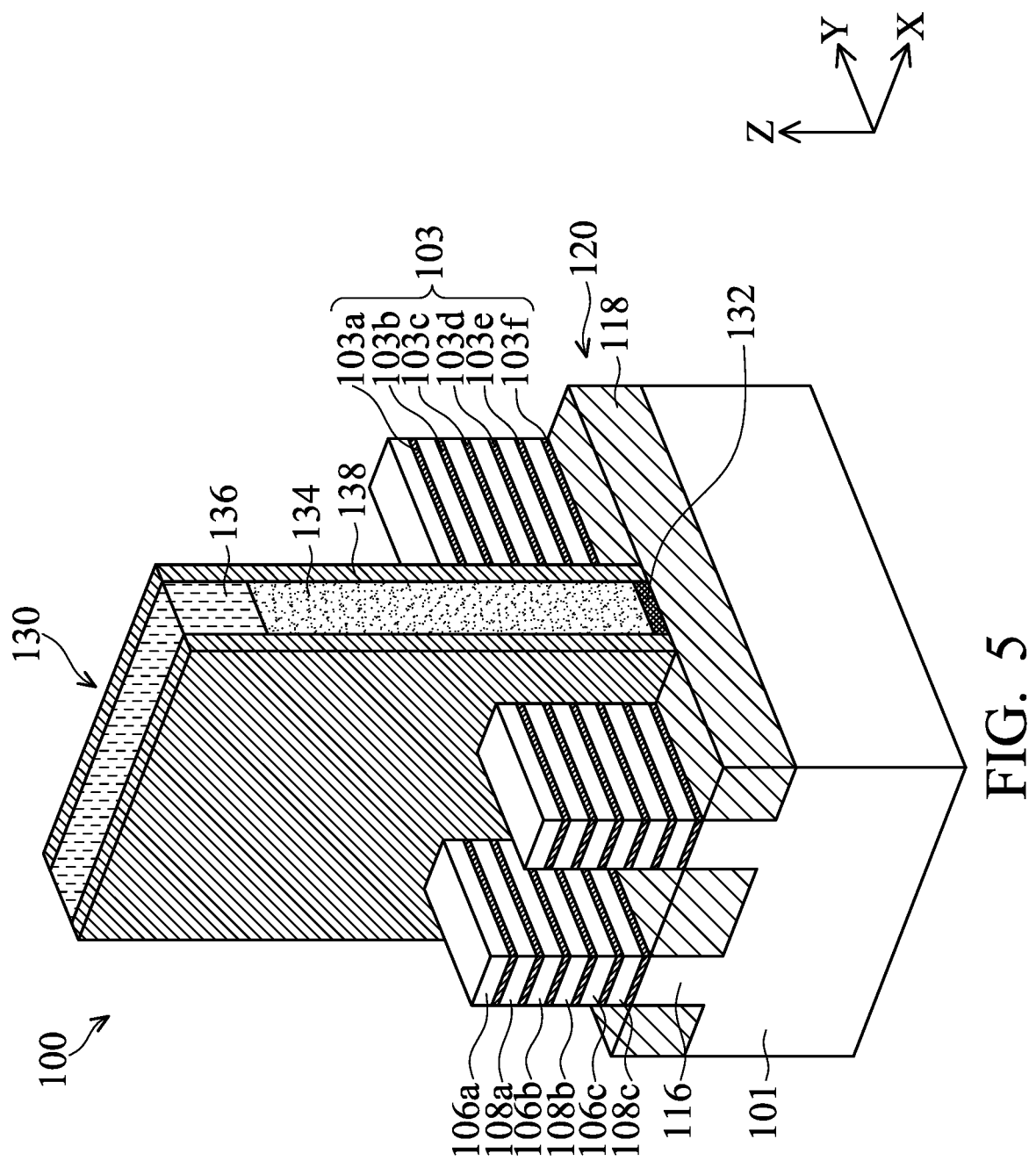

In FIG. 5, one or more sacrificial gate structures 130 (only one is shown) are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, and then patterning those layers into the sacrificial gate structures 130. Gate spacers 138 are then formed on sidewalls of the sacrificial gate structures 130. The gate spacers 138 may be formed by conformally depositing one or more layers for the gate spacers 138 and anisotropically etching the one or more layers, for example. While one sacrificial gate structure 130 is shown, two or more sacrificial gate structures 130 may be arranged along the X direction in some embodiments.

The sacrificial gate dielectric layer 132 may include one or more layers of dielectric material, such as a silicon oxide-based material. The sacrificial gate electrode layer 134 may include silicon such as polycrystalline silicon or amorphous silicon. The mask layer 136 may include more than one layer, such as an oxide layer and a nitride layer. The gate spacer 138 may be made of a dielectric material such as silicon oxide, silicon nitride, silicon carbide, silicon oxynitride, SiCN, silicon oxycarbide, SiOCN, and/or combinations thereof.

The portions of the fin structures 112 that are covered by the sacrificial gate electrode layer 134 of the sacrificial gate structure 130 serve as channel regions for the semiconductor device structure 100. The fin structures 112 that are partially exposed on opposite sides of the sacrificial gate structure 130 define source/drain (S/D) regions for the semiconductor device structure 100. In some cases, some S/D regions may be shared between various transistors. For example, various one of the S/D regions may be connected together and implemented as multiple functional transistors. It should be understood that the source region and the drain region can be interchangeably used since the epitaxial features to be formed in these regions are substantially the same.

Figure 6:
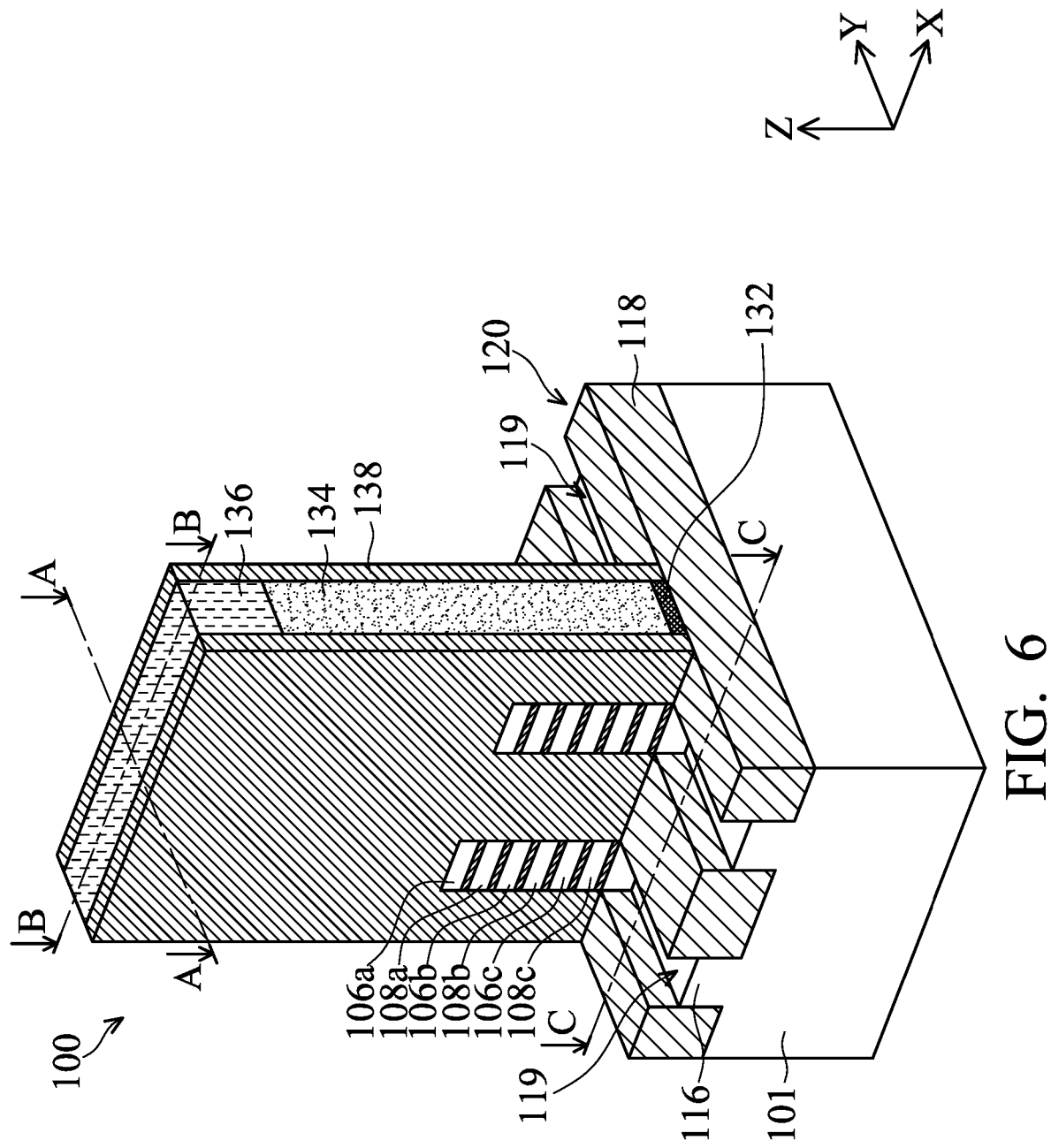

In FIG. 6, the portions of the fin structures 112 in the S/D regions (e.g., regions on opposite sides of the sacrificial gate structure 130) are recessed down below the top surface of the isolation region 120 (or the insulating material 118), by removing portions of the fin structures 112 not covered by the sacrificial gate structure 130. The recess of the portions of the fin structures 112 can be done by an etch process, either isotropic or anisotropic etch process, or further, may be selective with respect to one or more crystalline planes of the substrate 101. The etch process may be a dry etch, such as a RIE, NBE, or the like, or a wet etch, such as using tetramethylammonium hydroxide (TMAH), ammonium hydroxide (NH$_4$OH), or any suitable etchant. Trenches 119 are formed in the S/D regions as the result of the recess of the portions of the fin structures 112.

FIGS. 7A, 7B, and 7C are cross-sectional side views of the semiconductor device structure 100 taken along line A-A, line B-B, and line C-C of FIG. 6, respectively.

FIGS. 8A, 8B, and 8C are cross-sectional side views of one of various stages of manufacturing the semiconductor device structure 100 taken along line A-A, line B-B, and line C-C of FIG. 6, respectively, in accordance with some embodiments. As shown in FIG. 8A, edge portions of each second semiconductor layer 108 of the stack of layers 104 are removed horizontally along the X direction. The removal of the edge portions of the second semiconductor layers 108 forms cavities. In some embodiments, the portions of the second semiconductor layers 108 are removed by a selective etch process. The selective etch process removes the second semiconductor layers 108 but not the mask layer 136, the gate spacers 138, the first semiconductor layers 106, and the dopant suppression layers 103. In cases where the second semiconductor layers 108 are made of SiGe and the first semiconductor layers 106 are made of silicon, the second semiconductor layer 108 can be selectively etched using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions.

After removing edge portions of each second semiconductor layers 108, a dielectric layer (or so-called inner spacer) is deposited in the cavities to form dielectric spacers 144. The dielectric spacers 144 are in contact with portions of the dopant suppression layers 103, as shown in FIG. 8A. The dielectric spacers 144 may be made of a low-K dielectric material, such as SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144 formed in the cavities. The dielectric spacers 144 are protected by the first semiconductor layers 106 and the dopant suppression layers 103 during the anisotropic etching process. The remaining second semiconductor layers 108 are capped between the dielectric spacers 144 along the X direction.

FIGS. 9A, 9B, and 9C are cross-sectional side views of one of various stages of manufacturing the semiconductor device structure 100 taken along line A-A, line B-B, and line C-C of FIG. 6, respectively, in accordance with some embodiments. As shown in FIGS. 9A and 9C, epitaxial S/D features 146 are formed in the source/drain (S/D) regions. The epitaxial S/D features 146 may be made of one or more layers of Si, SiP, SiC and SiCP for n-channel FETs or Si, SiGe, Ge for p-channel FETs. For p-channel FETs, p-type dopants, such as boron (B), aluminum (Al), or gallium (Ga), may also be included in the epitaxial S/D features 146. For n-channel FETs, n-type dopants, such as phosphorus (P), arsenic (As) or antimony (Sb), may also be included in the epitaxial S/D features 146. The epitaxial S/D features 146 may be formed by an epitaxial growth method using CVD, ALD or MBE.

In one example shown in FIG. 9A, one of a pair of epitaxial S/D features 146 disposed on one side of the sacrificial gate structure 130 is designated as a source feature/terminal, and the other of the pair of epitaxial S/D features 146 disposed on the other side of the sacrificial gate structure 130 is designated as a drain feature/terminal. The source feature/terminal and the drain feature/terminal are connected by the channel layers (e.g., the first semiconductor layers 106). The epitaxial S/D features 146 are in contact with the first semiconductor layer 106 and the dopant suppression layers 103 under the sacrificial gate structure 130. In some cases, the epitaxial S/D features 146 may grow pass the topmost semiconductor channel, i.e., the first semiconductor layer 106 under the sacrificial gate structure 130, to be in contact with the gate spacers 138. The second semiconductor layer 108 under the sacrificial gate structure 130 are separated from the epitaxial S/D features 146 by the dielectric spacers 144.

The epitaxial S/D features 146 may grow both vertically and horizontally to form facets, which may correspond to crystalline planes of the material used for the substrate 101. In some cases, the epitaxial S/D features 146 of a fin structure may grow and merge with the epitaxial S/D features 146 of the neighboring fin structures, as one example shown in FIG. 9C.

FIGS. 10A, 10B, and 10C are cross-sectional side views of one of various stages of manufacturing the semiconductor device structure 100 taken along line A-A, line B-B, and line C-C of FIG. 6, respectively, in accordance with some embodiments. In FIGS. 10A, 10B, and 10C, a contact etch stop layer (CESL) 162 is conformally formed on the exposed surfaces of the semiconductor device structure 100. The CESL 162 covers the sidewalls of the sacrificial gate structure 130, the insulating material 118, the epitaxial S/D features 146, and the exposed surface of the stack of layers 104. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an inter-layer dielectric (ILD) layer 164 is formed on the CESL 162 over the semiconductor device structure 100. The materials for the ILD layer 164 may include compounds comprising Si, O, C, and/or H, such as silicon oxide, TEOS oxide, SiCOH and SiOC. Organic materials, such as polymers, may also be used for the ILD layer 164. The ILD layer 164 may be deposited by a PECVD process or other suitable deposition technique. In some embodiments, after formation of the ILD layer 164, the semiconductor device structure 100 may be subject to a thermal process to anneal the ILD layer 164.

FIGS. 11A, 11B, and 11C are cross-sectional side views of one of various stages of manufacturing the semiconductor device structure 100 taken along line A-A, line B-B, and line C-C of FIG. 6, respectively, in accordance with some embodiments. As shown in FIG. 11A, after the ILD layer 164 is formed, a planarization operation, such as CMP, is performed on the semiconductor device structure 100 until the sacrificial gate electrode layer 134 is exposed.

FIGS. 12A, 12B, and 12C are cross-sectional side views of one of various stages of manufacturing the semiconductor device structure 100 taken along line A-A, line B-B, and line C-C of FIG. 6, respectively, in accordance with some embodiments. As shown in FIGS. 12A and 12B, the sacrificial gate structure 130 is removed. The ILD layer 164 protects the epitaxial S/D features 146 during the removal of the sacrificial gate structure 130. The sacrificial gate structure 130 can be removed using plasma dry etching and/or wet etching. For example, in cases where the sacrificial gate electrode layer 134 is polysilicon and the ILD layer 164 is silicon oxide, a wet etchant such as a tetramethylammonium hydroxide (TMAH) solution can be used to selectively remove the sacrificial gate electrode layer 134 without removing the dielectric materials of the ILD layer 164, the CESL 162, and the gate spacers 138. The sacrificial gate dielectric layer 132 is thereafter removed using plasma dry etching and/or wet etching. The removal of the sacrificial gate structure 130 (i.e., the sacrificial gate electrode layer 134 and the sacrificial gate dielectric layer 132) forms a trench 166 in the regions where the sacrificial gate electrode layer 134 and the sacrificial gate dielectric layer 132 were removed. The trench 166 exposes the top and sides of the stack of layers 104 (e.g., the first semiconductor layers 106, the second semiconductor layers 108, and the dopant suppression layers 103, as shown in FIG. 12B).

FIGS. 13A, 13B, and 13C are cross-sectional side views of one of various stages of manufacturing the semiconductor device structure 100 taken along line A-A, line B-B, and line C-C of FIG. 6, respectively, in accordance with some embodiments. As shown in FIGS. 13A and 13B, the second semiconductor layers 108 (e.g., 108a, 108b, 108c) are removed. The removal of the second semiconductor layers 108 exposes the dielectric spacers 144, the first semiconductor layers 106 (e.g., 106a, 106b, 106c), and the dopant suppression layers 103 (e.g., 103a-103f). The removal process may be any suitable etch processes, such as dry etch, wet etch, or a combination thereof. The etch process may be a selective etch process that removes the second semiconductor layers 108 but not the gate spacers 138, the CESL 162, the dielectric material 125, the first semiconductor layers 106, and the dopant suppression layers 103. As a result, openings 151 are formed around the first semiconductor layers 106 and the dopant suppression layers 103, as shown in FIG. 13B. That is, portions of the first semiconductor layers 106 and the dopant suppression layers 103 not covered by the dielectric spacers 144 are exposed to the openings 151.

Figure 14A:
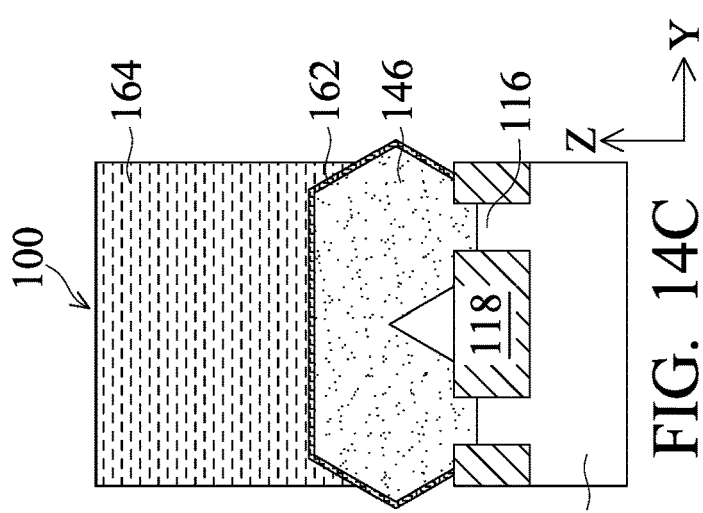
Figure 14B:
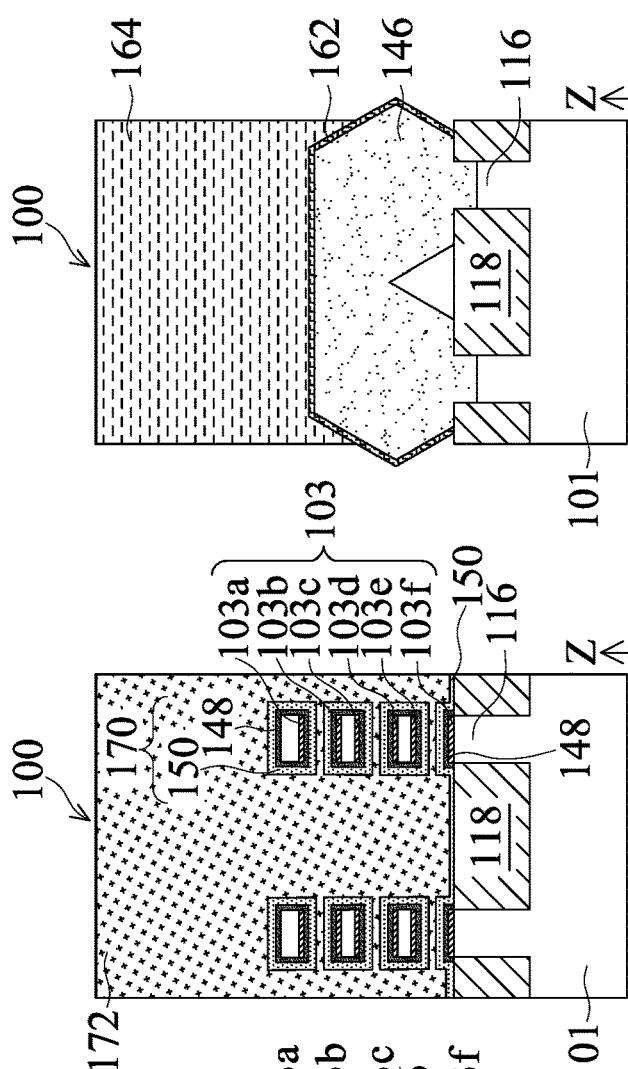
Figure 14C:
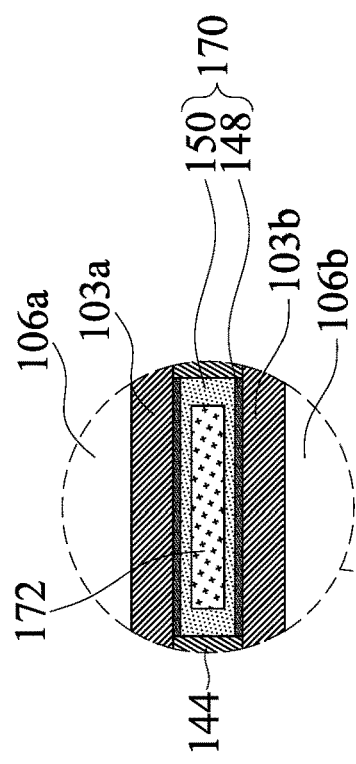

FIGS. 14A, 14B, and 14C are cross-sectional side views of one of various stages of manufacturing the semiconductor device structure 100 taken along line A-A, line B-B, and line C-C of FIG. 6, respectively, in accordance with some embodiments. As shown in FIGS. 14A and 14B, a gate dielectric layer 170 is formed to surround the exposed surfaces of the first semiconductor layers 106 and the dopant suppression layers 103. A gate electrode layer 172 is then formed on the gate dielectric layer 170. The gate dielectric layer 170 and the gate electrode layer 172 may be collectively referred to as a gate structure.

Figure 14D:
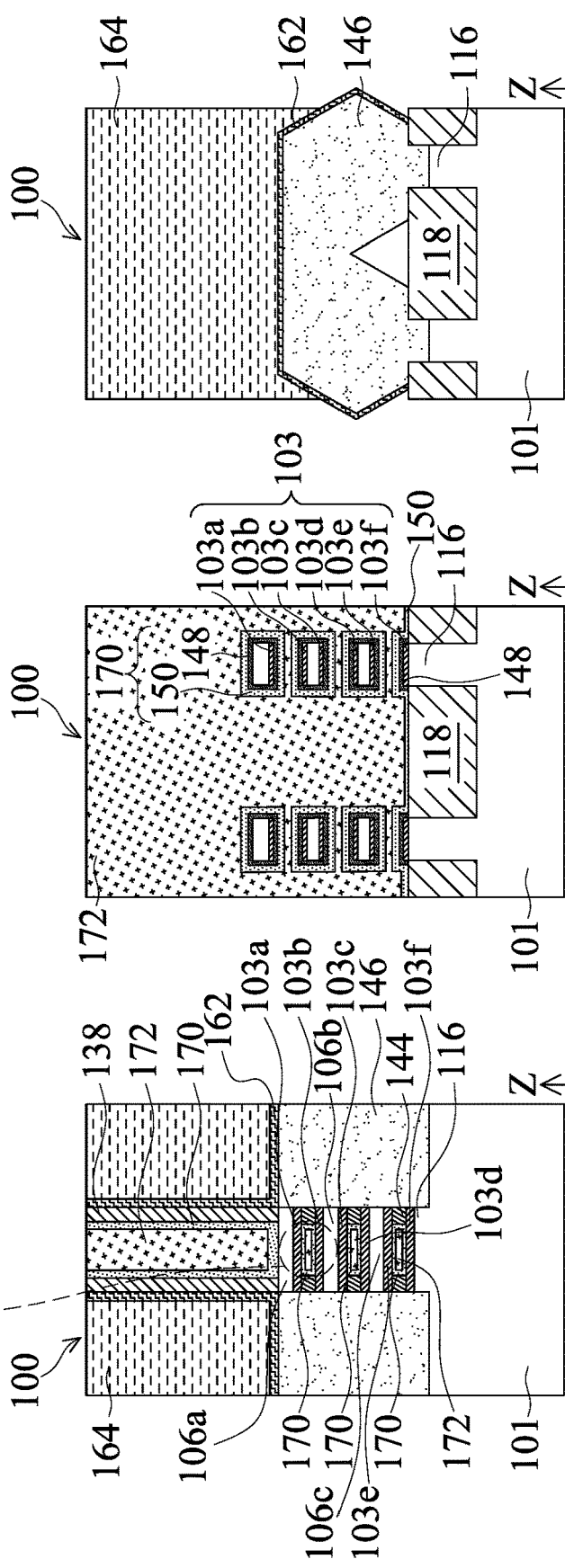
FIG. 14D shows an enlarged view of a portion of the semiconductor device structure shown in FIG. 14A, in accordance with some embodiments.

In some embodiments, the gate dielectric layer 170 includes an interfacial layer (IL) 148 and a high-K (HK) dielectric layer 150. FIG. 14D illustrates an enlarged view of a portion of the nanosheet channels showing the IL 148 and the HK dielectric layer 150. In one embodiment, the IL 148 is in contact with the exposed surfaces of the first semiconductor layers 106a, 106b, 106c. The IL 148 is also in contact with the dopant suppression layers 103a, 103b, 103c, 103d, 103e, 103f. In some embodiments, the IL 148 may also form on the well portion 116 of the substrate 101. The HK dielectric layer 150 is formed to surround and in contact with the IL 148. The IL 148 may include or be made of an oxygen-containing material or a silicon-containing material, such as silicon oxide, silicon oxynitride, oxynitride, hafnium silicate, etc. The IL 148 may be formed by CVD, ALD or any suitable conformal deposition technique. In one embodiment, the IL 148 is formed using ALD.

The HK dielectric layer 150 may include or made of one or more layers of a dielectric material, such as silicon oxide, silicon nitride, or high-K dielectric material. Examples of HK dielectric material 150 may include, but are not limited to, hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HMO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), hafnium dioxide-alumina ($HfO_2$—$Al_2O_3$) alloy, or other suitable high-k materials. The HK dielectric layer 150 may be a conformal layer formed by a conformal process, such as an ALD process or a CVD process.

The gate electrode layer 172 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or any combinations thereof. The gate electrode layer 172 may be formed by CVD, ALD, electro-plating, or other suitable deposition technique. The gate electrode layer 172 may be also deposited over the upper surface of the ILD layer 164. The gate dielectric layer 170 and the gate electrode layer 172 formed over the ILD layer 164 are then removed by using, for example, CMP, until the top surface of the ILD layer 164 is exposed.

FIG. 14D shows the longitudinal surfaces of the first semiconductor layers 106 (e.g., first semiconductor layers 106a, 106b) are covered by the dopant suppression layers 103 (e.g., 103a, 103b). The dopant suppression layers 103 prevent or at least minimize diffusion of dopants into the nanosheet channels (e.g., first semiconductor layers 106) from the (S/D) regions through the interfaces between the nanosheet channels (e.g., first semiconductor layers 106a, 106b) and the layers abutting against the nanosheet channels.

FIGS. 15A, 15B, and 15C are cross-sectional side views of one of various stages of manufacturing the semiconductor device structure 100 taken along line A-A, line B-B, and line C-C of FIG. 6, respectively, in accordance with some embodiments. In FIGS. 15A and 15C, source/drain (S/D) contacts 176 are formed in the ILD layer 164. Prior to forming the S/D contacts 176, contact openings are formed in the ILD layer 164 to expose the epitaxial S/D features 146. Suitable photolithographic and etching techniques are used to form the contact openings through various layers, including the ILD layer 164 and the CESL 162 to expose the epitaxial S/D features 146. In some embodiments, the upper portions of the epitaxial S/D features 146 are etched.

After the formation of the contact openings, a silicide layer 178 is formed on the epitaxial S/D features 146. The silicide layer 178 conductively couples the epitaxial S/D features 146 to the subsequently formed S/D contacts 176. The silicide layer 178 may be formed by depositing a metal source layer over the epitaxial S/D features 146 and performing a rapid thermal annealing process. During the rapid anneal process, the portion of the metal source layer over the epitaxial S/D features 146 reacts with silicon in the epitaxial S/D features 146 to form the silicide layer 178. Unreacted portion of the metal source layer is then removed. For n-channel FETs, the silicide layer 178 may be made of a material including one or more of TiSi, CrSi, TaSi, MoSi, ZrSi, HfSi, ScSi, Ysi, HoSi, TbSI, GdSi, LuSi, DySi, ErSi, YbSi, or combinations thereof. For p-channel FETs, the silicide layer 178 may be made of a material including one or more of NiSi, CoSi, MnSi, Wsi, FeSi, RhSi, PdSi, RuSi, PtSi, IrSi, OsSi, or combinations thereof. In some embodiments, the silicide layer 178 is made of a metal or metal alloy silicide, and the metal includes a noble metal, a refractory metal, a rare earth metal, alloys thereof, or combinations thereof. Next, a conductive material is formed in the contact openings and form the S/D contacts 176. The conductive material may be made of a material including one or more of Ru, Mo, Co, Ni. W, Ti, Ta, Cu, Al, TiN and TaN. While not shown, a barrier layer (e.g., TiN, TaN, or the like) may be formed on sidewalls of the contact openings prior to forming the S/D contacts 176. Then, a planarization process, such as CMP, is performed to remove excess deposition of the contact material and expose the top surface of the gate electrode layer 172.

It is understood that the semiconductor device structure 100 may undergo further complementary metal oxide semiconductor (CMOS) and/or back-end-of-line (BEOL) processes to form various features such as transistors, contacts/vias, interconnect metal layers, dielectric layers, passivation layers, etc. The semiconductor device structure 100 may also include backside contacts (not shown) on the backside of the substrate 101 so that either source or drain of the epitaxial S/D features 146 is connected to a backside power rail (e.g., positive voltage VDD or negative voltage VSS) through the backside contacts.

Figure 16B:
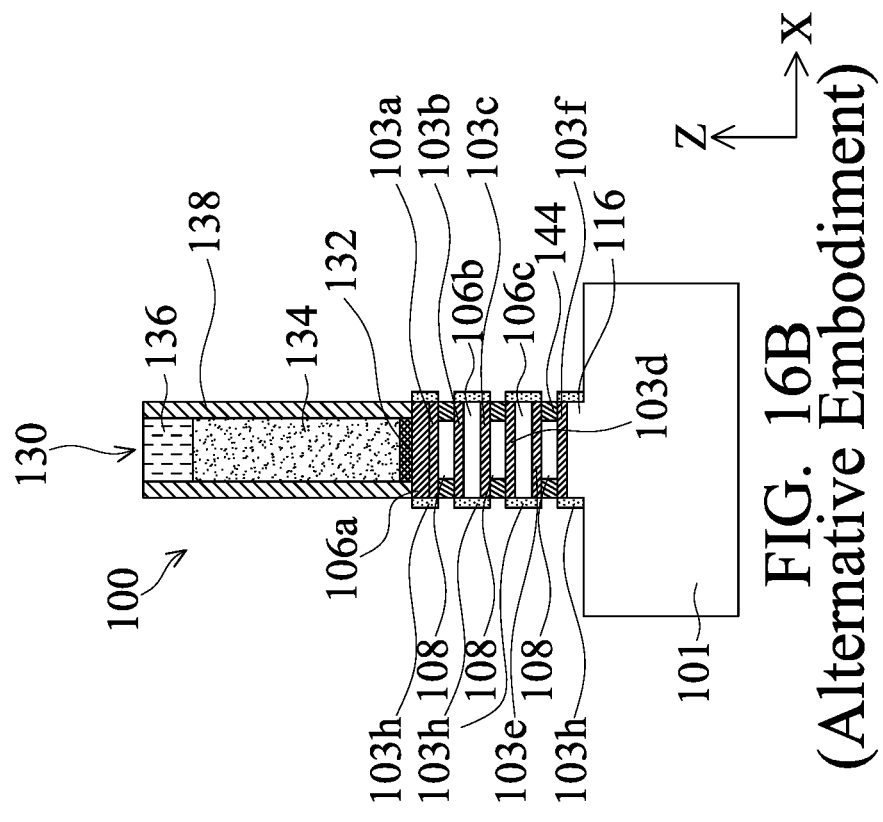
FIGS. 16A and 16B are cross-sectional side views of one of various stages of manufacturing the semiconductor device structure taken along line A-A of FIG. 6 in accordance with some embodiments.
Figure 16A:
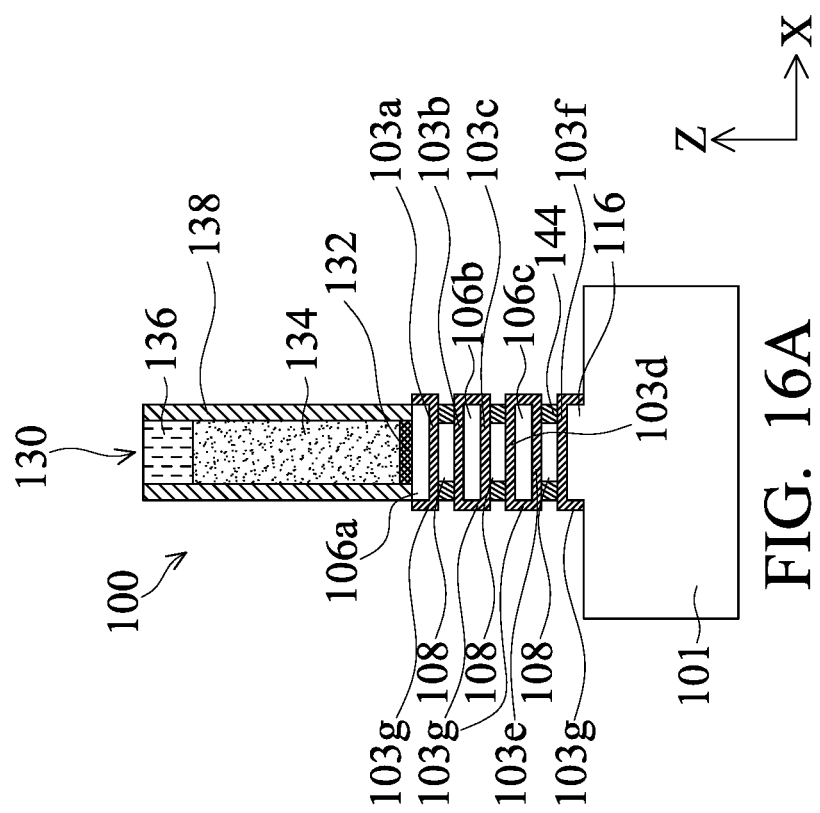

FIG. 16A illustrates a cross-sectional side view of one of various stages of manufacturing the semiconductor device structure 100 taken along line A-A of FIG. 6 in accordance with some embodiments. The embodiment shown in FIG. 16A is substantially identical to the embodiment shown in FIG. 15A except that the dopant suppression layer 103 is further extended to cover the entire exposed surfaces of the first semiconductor layers 106. In this embodiment, after the dielectric spacers 144 are formed in the cavities (formed as the result of removal of the edge portions of the second semiconductor layers 108, e.g., FIG. 8A), an extended dopant suppression layer 103g, such as the dopant suppression layer 103, is formed on the exposed surfaces of the first semiconductor layers 106a, 106b, 106c. The extended dopant suppression layer 103g may use the same material as the dopant suppression layer 103. In the embodiment shown in FIG. 16A, the extended dopant suppression layer 103g and the dopant suppression layer 103a together cover and in contact with the exposed surfaces of the first semiconductor layer 106a, the extended dopant suppression layer 103g and the dopant suppression layers 103b and 103c together cover and in contact with the exposed surfaces of the first semiconductor layer 106b, the extended dopant suppression layer 103g and the dopant suppression layers 103d and 103e together cover and in contact with the exposed surfaces of the first semiconductor layer 106c, and the extended dopant suppression layer 103g and the dopant suppression layer 103f together cover and in contact with the exposed surfaces of the well portion 116 of the substrate 101 and the second semiconductor layer 108c.

The extended dopant suppression layer 103g may be formed on the first semiconductor layers 106 by a selective deposition process, such as selective ALD process. The selective ALD process allows the extended dopant suppression layer 103g to be selectively deposited on the exposed surfaces of the first semiconductor layers 106 relative to the sidewall of the gate spacers 138 and the dielectric spacers 144. The extended dopant suppression layer 103g may also form on the dopant suppression layers 103a-103f. The extended dopant suppression layer 103g may have the same thickness as the dopant suppression layer 103.

FIG. 16B illustrates a cross-sectional side view of one of various stages of manufacturing the semiconductor device structure 100 taken along line A-A of FIG. 6 in accordance with an alternative embodiment. The embodiment shown in FIG. 16B is substantially identical to the embodiment shown in FIG. 16A except that the extended dopant suppression layer 103g is formed from a material different than that of the dopant suppression layer 103. In this embodiment, an extended dopant suppression layer 103h is formed to cover the entire exposed surfaces of the first semiconductor layers 106. Particularly, the extended dopant suppression layer 103h and the dopant suppression layer 103a cover and in contact with the exposed surfaces of the first semiconductor layer 106a, the extended dopant suppression layer 103h and the dopant suppression layers 103b and 103c cover and in contact with the exposed surfaces of the first semiconductor layer 106b, the extended dopant suppression layer 103h and the dopant suppression layers 103d and 103e cover and in contact with at the exposed surfaces of the first semiconductor layer 106c, and the extended dopant suppression layer 103h and the dopant suppression layer 103f cover and in contact with the exposed surfaces of the well portion 116 of the substrate 101.

Suitable materials for the extended dopant suppression layer 103h may include, but are not limited to, a silicon-containing layer or a carbon-containing layer, such as silicon carbide, carbon doped silicon, silicon carbonitride (nitride-bonded silicon carbide or silicon carbide doped with nitrogen), or any suitable material that contains at least the elements silicon and carbon; arsenic doped silicon carbide, arsenic doped silicon, or any suitable material containing at least the elements silicon and arsenic, which may contain one or more additional elements, such as carbon; and fluorine-rich silicon, such as silicon fluoride or any suitable material containing at least the elements silicon and fluorine.

After the formation of the extended dopant suppression layers 103g (FIG. 16A) or 103h (FIG. 16B), the semiconductor device structure 100 is subjected to various processes as discussed above with respect to FIGS. 9A-9C to 15A-15C. FIGS. 17A-17C illustrate cross-sectional side views of the semiconductor device structure 100 of FIG. 16A after the processes discussed above with respect to 9A-9C to 15A-15C are performed on the semiconductor device structure 100. FIG. 17D illustrates an enlarged view of a portion of the nanosheet channels according to some embodiments of the present disclosure. As can be seen in FIG. 17D, the exposed surfaces of the first semiconductor layers 106 (e.g., first semiconductor layers 106a, 106b) are entirely covered by the dopant suppression layers 103 (e.g., 103a, 103b) and the extended dopant suppression layer 103g. The dopant suppression layers 103 prevent or at least minimize diffusion of dopants from the epitaxial S/D features 146 into the nanosheet channels (e.g., first semiconductor layers 106) through the interfaces between the nanosheet channels and the layers abutting against the nanosheet channels. The dopant suppression layers 103 (e.g., 103a, 103b) and the extended dopant suppression layer 103g also help confine the dopants at the edge of the epitaxial S/D features 146 near the nanosheet channels (e.g., regions near and along the extended dopant suppression layer 103g and the dielectric spacers 144), thereby forming lightly doped source and drain region. The lightly doped source and drain region minimizes hot electron injection into the gate and improves the speed and reliability of the semiconductor device structure 100.

FIG. 17D further illustrates a gate dielectric layer (e.g., the gate dielectric layer 170) is formed to surround the first semiconductor layers 106 and the dopant suppression layers 103. The gate dielectric layer may include an interfacial layer (IL) (e.g., IL 148) and a high-K (HK) dielectric layer (e.g., HK dielectric layer 150). A gate electrode layer (e.g., the gate electrode layer 172) is formed on the gate dielectric layer 170. Contact openings are formed through the ILD layer 164 and the CESL 162 to expose the epitaxial S/D features 146. A silicide layer, such as the silicide layer 178, is formed on the epitaxial S/D features 146. The silicide layer 178 conductively couples the epitaxial S/D features 146 to the subsequently formed S/D contacts (e.g., S/D contacts 176), as discussed above with respect to FIGS. 15A-15C. Then, a planarization process, such as CMP, is performed to remove excess deposition of the contact material and expose the top surface of the gate electrode layer 172.

Figure 18:
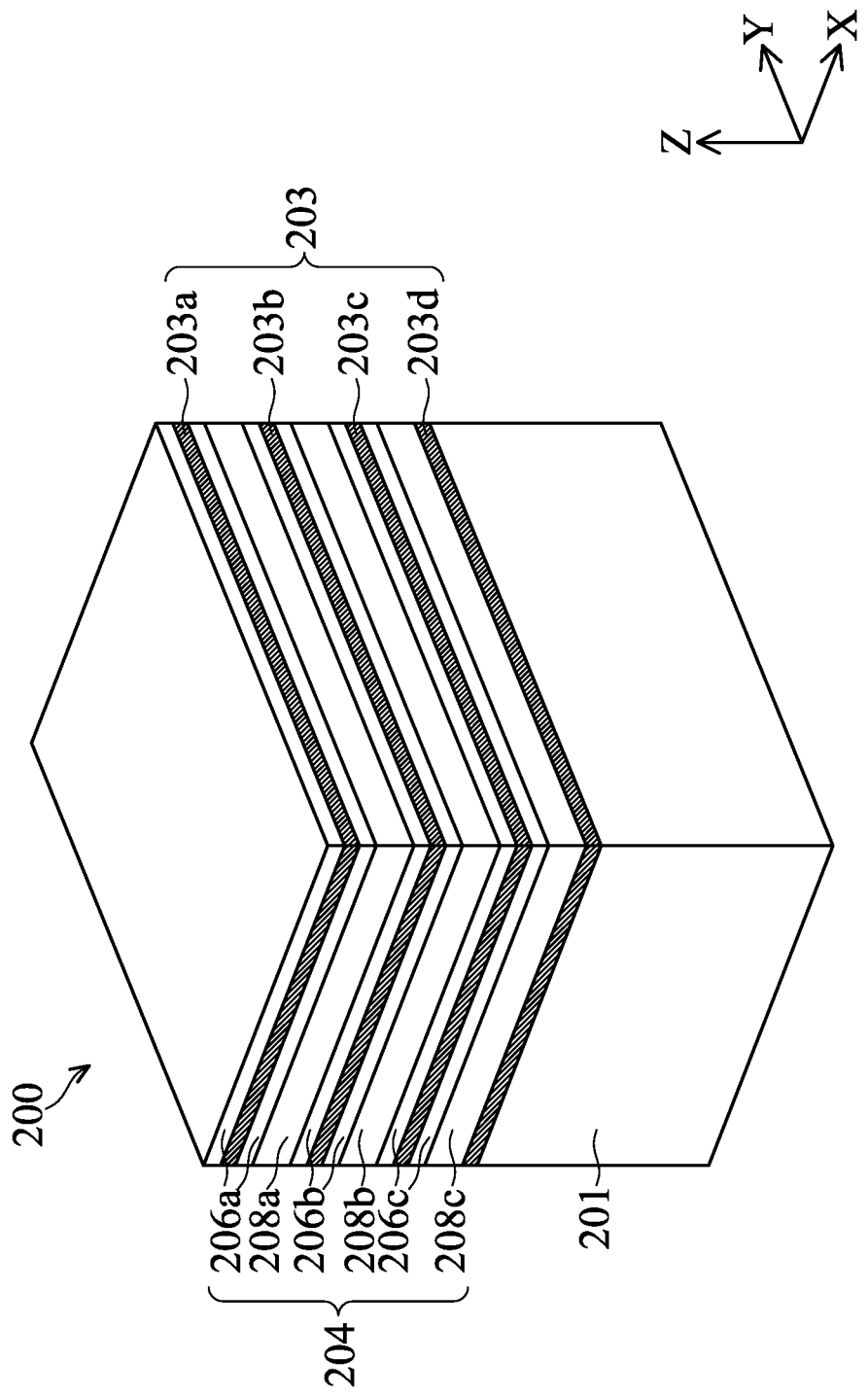
FIG. 18 illustrates a perspective view of a semiconductor device structure in accordance with some alternative embodiments.

FIG. 18 illustrates a perspective view of a semiconductor device structure 200 in accordance with some alternative embodiments. The embodiment shown in FIG. 18 is similar to the embodiment of FIG. 1 except that dopant suppression layers are formed in the first semiconductor layers. As can be seen in FIG. 18, the semiconductor device structure 200 includes a stack of layers 204 formed over a front side of a substrate 201. The substrate 201 can be formed from the same material as the substrate 101 discussed above, and the substrate 201 may include various regions that have been doped with p-type or n-type impurities. Similar to the stack of layers 104, the stack of layers 204 includes alternating first semiconductor layers 206 (206a-206c) and second semiconductor layers 208 (208a-208c). For example, the second semiconductor layer 208a is disposed between the first semiconductor layer 206a and the first semiconductor layer 206b, the second semiconductor layer 208b is disposed between the first semiconductor layer 206b and the first semiconductor layer 206c, and the second semiconductor layer 208c is disposed between the first semiconductor layer 206c and the substrate 201. The first and second semiconductor layers 206, 208 can be formed from the same material as that of the first and second semiconductor layers 106, 108. In one embodiment, the first semiconductor layers 206 may be made of Si and the second semiconductor layers 208 may be made of SiGe. The first and second semiconductor layers 206, 208 may have the same thickness as that of the first and second semiconductor layers 106, 108.

While three first semiconductor layers 206 and three second semiconductor layers 208 are illustrated in FIG. 18, any number of the first and second semiconductor layers 206, 208 can be formed in the stack of layers 204, and the number of layers depending on the predetermined number of channels for the semiconductor device structure 200.

The stack of layers 204 also includes a plurality of dopant suppression layers 203 (203a-d) formed over the front side of the substrate 101. The dopant suppression layers 203 can be formed from the same material as the dopant suppression layers 103, such as silicon carbide, carbon doped silicon, arsenic doped silicon carbide, or fluorine-rich silicon, etc., as discussed in various embodiments above. In some embodiments, one or more dopant suppression layers 203 are formed in the first semiconductor layer 206. Stated differently, each first semiconductor layer 206a, 206b, 206c has an upper portion and a lower portion, and the dopant suppression layer 203a, 203b, 203c is sandwiched between the upper portion and the lower portion of each of the first semiconductor layers 206a, 206b, 206c, respectively. In the embodiment shown in FIG. 18, for example, the dopant suppression layer 203a is disposed in the first semiconductor layer 206a and has its top and bottom surfaces in contact with the first semiconductor layer 206a, the dopant suppression layer 203b is disposed in the first semiconductor layer 206b and has its top and bottom surfaces in contact with the first semiconductor layer 206b, the dopant suppression layer 203c is disposed in the first semiconductor layer 206c and has its top and bottom surfaces in contact with the first semiconductor layer 206c, and the dopant suppression layer 203d is disposed between and in contact with the substrate 101 and the second semiconductor layer 208c. Likewise, each of the dopant suppression layers 203 may have the same thickness as that of the dopant suppression layers 103.

FIGS. 19A, 19B, 19C are cross-sectional side views of one of various stages of manufacturing the semiconductor device structure 200 after the processes discussed above in FIGS. 2-6 are performed on the semiconductor device structure 200. A sacrificial gate structure 230, such as the sacrificial gate structure 130, is formed on the semiconductor device structure 200. The sacrificial gate structure 230 includes a sacrificial gate dielectric layer 232 (e.g., sacrificial gate dielectric layer 132), a sacrificial gate electrode layer 234 (e.g., sacrificial gate electrode layer 134), and a mask layer 236 (e.g., mask layer 136). Gate spacers 238 (e.g., gate spacers 138) are then formed on sidewalls of the sacrificial gate structures 230. FIGS. 19A, 19B, and 19C show cross-sectional side views of the semiconductor device structure 200 taken along a first line parallel to an extension direction along the fin structures (e.g., line A-A of FIG. 6), a second line parallel to an extension direction perpendicular to the first line and along the gate structure (e.g., line B-B of FIG. 6), and a third line parallel to an extension direction perpendicular to the first line and along the source or drain regions (e.g., line C-C of FIG. 6), respectively. The fin structures in the S/D regions (e.g., regions on opposite sides of the sacrificial gate structure 130) are recessed down below the top surface of an insulating material 218 (e.g., insulating material 118).

FIGS. 20A, 20B, and 20C are cross-sectional side views of one of various stages of manufacturing the semiconductor device structure 200 taken along the first line (e.g., line A-A of FIG. 6), the second line (e.g., line B-B of FIG. 6), and the third line (e.g., line C-C of FIG. 6), respectively, in accordance with some embodiments. Like the processes shown in FIG. 8A, edge portions of each second semiconductor layer 208 are removed horizontally along the X direction. A dielectric spacer 244 (e.g., dielectric spacers 144) is then formed in the cavities formed as the result of removal of the edge portions of the second semiconductor layers 208, as shown in FIG. 20A. The dielectric spacers 244 may be formed of the same material as the dielectric spacers 144.

FIGS. 21A, 21B, and 21C are cross-sectional side views of one of various stages of manufacturing the semiconductor device structure 200 taken along the first line (e.g., line A-A of FIG. 6), the second line (e.g., line B-B of FIG. 6), and the third line (e.g., line C-C of FIG. 6), respectively, in accordance with some embodiments. Like the processes shown in FIG. 16A, after the formation of the dielectric spacers 244, an extended dopant suppression layer 203g, such as the dopant suppression layer 103g, is formed on the exposed surfaces of the first semiconductor layers 206a, 206b, 206c. The extended dopant suppression layer 203g may use the same material as the dopant suppression layer 103. In the embodiment shown in FIG. 21A, the extended dopant suppression layer 203g and the dopant suppression layer 203a together form the shape of a capital "H" (with respect to the cross-sectional view of the semiconductor device structure) and are in contact with the first semiconductor layer 206a, the extended dopant suppression layer 203g and the dopant suppression layers 203b together form the shape of a capital "H" (with respect to the cross-sectional view of the semiconductor device structure) and are in contact with the first semiconductor layer 206b, the extended dopant suppression layer 203g and the dopant suppression layers 203c together form the shape of a capital "H" (with respect to the cross-sectional view of the semiconductor device structure) and are in contact with the first semiconductor layer 206c, and the extended dopant suppression layer 203g and the dopant suppression layer 203d are in contact with the exposed surfaces of the well portion 116 of the substrate 101 and the second semiconductor layer 208c.

In some embodiments, the extended dopant suppression layer 203g is formed from a material different than that of the dopant suppression layer 203 (e.g., 203a-203d), such as the material used for the extended dopant suppression layer 103h discussed above in FIG. 16B.

Likewise, the extended dopant suppression layer 203g may be formed on the first semiconductor layers 206 by a selective deposition process, such as selective ALD process used for forming the extended dopant suppression layer 103g. The extended dopant suppression layer 203g may also form on the dopant suppression layers 203a-203d. The extended dopant suppression layer 203g may have the same thickness as the dopant suppression layer 103g.

After the formation of the extended dopant suppression layers 203g, the semiconductor device structure 200 is subjected to various processes, as discussed above with respect to FIGS. 9A-9C to 15A-15C. FIGS. 22A-22C illustrate cross-sectional side views of the semiconductor device structure 200 of FIG. 21A after the processes discussed above with respect to 9A-9C to 15A-15C are performed on the semiconductor device structure 200. FIG. 22D is an enlarged view of a portion of the nanosheet channels of the semiconductor device structure 200 according to some embodiments of the present disclosure.

In FIG. 22A, a gate electrode layer 272 (e.g., gate electrode layer 172) is formed on the gate dielectric layer 270. Contact openings are formed through an ILD layer 264 (e.g., ILD layer 164) and a CESL 262 (e.g., CESL 162) to expose epitaxial S/D features 246 (e.g., epitaxial S/D features 146). A silicide layer 278, such as the silicide layer 178, is formed on the epitaxial S/D features 246. The silicide layer 178 conductively couples the epitaxial S/D features 246 to the subsequently formed S/D contacts 276 (e.g., S/D contacts 176), as discussed above with respect to FIGS. 15A-15C. Then, a planarization process, such as CMP, is performed to remove excess deposition of the contact material and expose the top surface of the gate electrode layer 272.

As can be seen in FIG. 22D, a gate dielectric layer 270 (e.g., gate dielectric layer 170) is formed to surround the first semiconductor layers 206 (e.g., first semiconductor layers 206a, 206b). The gate dielectric layer 270 may include an IL 248 (e.g., IL 148) and a HK dielectric layer 250 (e.g., HK dielectric layer 150). The dopant suppression layer 203a extends through the first semiconductor layer 206a to join the extended dopant suppression layers 203g that covers and in contact with the exposed surfaces of the first semiconductor layers 206 (e.g., first semiconductor layers 206a). Stated differently, the first semiconductor layer 206a has an upper portion 206a-1 and a lower portion 206a-2, and the dopant suppression layer 203a is sandwiched between the upper portion 206a-1 and the lower portion 206a-2 of the first semiconductor layer 206a. Likewise, the dopant suppression layer 203b extends through the first semiconductor layer 206b to join the extended dopant suppression layers 203g that covers and in contact with the exposed surfaces of the first semiconductor layers 206 (e.g., first semiconductor layers 206b). Stated differently, the first semiconductor layer 206b has an upper portion 206b-1 and a lower portion 206b-2, and the dopant suppression layer 203b is sandwiched between the upper portion 206b-1 and the lower portion 206b-2 of the first semiconductor layer 206b.

The extended dopant suppression layers 203g prevent or at least minimize diffusion of dopants from the epitaxial S/D features 246 into the nanosheet channels (e.g., first semiconductor layers 206a, 206b). The extended dopant suppression layers 203g also help confine the dopants at the edge of the epitaxial S/D features 246 near the nanosheet channels (e.g., regions near and along the extended dopant suppression layer 203g and the dielectric spacers 244), thereby forming lightly doped source and drain region. The lightly doped source and drain region minimizes hot electron injection into the gate and improves the speed and reliability of the semiconductor device structure 200.

Embodiments of the present disclosure provide a semiconductor device structure having exposed surfaces of nanosheet channels covered by a dopant suppression layer to prevent dopant diffusion from source/drain (S/D) features into the nanosheet channels, which in turn mitigates electron mobility degradation. The dopant suppression layer also confines the dopants at the interface between the S/D features and the nanosheet channels, which improves S/D junction abruptness and reduces contact resistance at or near the nanosheet channels. Reduction of dopants in the nanosheet channels allows for fuller depletion in the nanosheet channels and results in less short-channel effects due to steeper sub-threshold current swing (SS) and smaller drain induced barrier lowering (DIBL). In addition, dopant suppression layers using carbon doped silicon also produce tensile strained nanosheet channels, which in turn enhances electron mobility of the semiconductor structure device.

An embodiment is a semiconductor device structure. The structure includes a first channel layer having a first surface and a second surface opposing the first surface, a second channel layer having a first surface and a second surface opposing the first surface of the second channel layer, and the first and second channel layers are formed of a first material. The structure also includes a first dopant suppression layer in contact with the second surface of the first channel layer, and a second dopant suppression layer parallel to the first dopant suppression layer. The second dopant suppression layer is in contact with the first surface of the second channel layer, and the first and second dopant suppression layers each comprises carbon or fluorine. The structure further includes a gate dielectric layer in contact with the first and second dopant suppression layers and the first surface of the first channel layer, and a gate electrode layer disposed on the gate dielectric layer.

Another embodiment is a semiconductor device structure. The structure includes a first channel layer formed of a first material, the first channel layer includes a first portion and a second portion, wherein the first portion has a first surface, a second surface opposing the first surface, a third surface, and a fourth surface opposing the third surface. The first surface connects the third surface to the fourth surface, and the second surface connects the third surface to the fourth surface. The second portion has a first surface, a second surface opposing the first surface of the second portion, a third surface, and a fourth surface opposing the third surface of the second portion. The surface of the second portion connects the third surface to the fourth surface of the second portion, and the second surface of the second portion connects the third surface to the fourth surface of the second portion. The structure also includes a dopant suppression layer. The dopant suppression layer includes a first part in contact with the second surface of the first portion and the first surface of the second portion, a second part connecting to the first part and in contact with the third surface of the first portion and the third surface of the second portion, and a third part connecting to the first part and in contact with the fourth surface of the first portion and the fourth surface of the second portion. The first part, the second part, and the third part form a shape of a capital "H" with respect to a cross-sectional view of the semiconductor device structure. The structure further includes a gate dielectric layer in contact with the first surface of the first portion and the second surface of the second portion, and a gate electrode layer disposed on the gate dielectric layer.

A further embodiment is a method for forming a semiconductor device structure. The method includes forming a stack of layers comprising a plurality of first semiconductor layers, a plurality of second semiconductor layers, and a plurality of first dopant suppression layers, wherein each second semiconductor layer is disposed between adjacent first dopant suppression layers of the plurality of first dopant suppression layers. The method also includes forming a first source/drain feature and a second source/drain feature, wherein the first and second source/drain features are in contact with the plurality of first semiconductor layers. The method also includes removing the plurality of second semiconductor layers to expose portions of the first semiconductor layer and portions of each of the plurality of first dopant suppression layers. The method also includes forming a gate dielectric layer to surround exposed portions of the plurality of first semiconductor layers and portions of each of the plurality of first dopant suppression layers. The method further includes forming a gate electrode layer to surround the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of forming a semiconductor device structure, comprising:
   forming a stack of layers comprising a plurality of first semiconductor layers, a plurality of second semiconductor layers, and a plurality of first dopant suppression layers, wherein each second semiconductor layer is disposed between adjacent first dopant suppression layers of the plurality of first dopant suppression layers;
   forming a first source/drain feature and a second source/drain feature, wherein the first and second source/drain features are in contact with the plurality of first semiconductor layers;
   removing the plurality of second semiconductor layers to expose portions of the first semiconductor layer and portions of each of the plurality of first dopant suppression layers;
   forming a gate dielectric layer to surround exposed portions of the plurality of first semiconductor layers and portions of each of the plurality of first dopant suppression layers; and
   forming a gate electrode layer to surround the gate dielectric layer.

2. The method of claim 1, further comprising:
   prior to forming a first source/drain feature and a second source/drain feature, selectively forming a second dopant suppression layer on a portion of the plurality of first semiconductor layers.

3. The method of claim 2, wherein the stack of layers is formed so that each dopant suppression layer is disposed in the first semiconductor layer.

4. The method of claim 2, wherein the first dopant suppression layer and the second dopant suppression layer are formed of the same material.

5. The method of claim 2, wherein the first dopant suppression layer and the second dopant suppression layer comprise a silicon-containing layer.

6. The method of claim 5, wherein the first dopant suppression layer and the second dopant suppression layer are silicon carbide, carbon doped silicon, silicon carbonitride, arsenic doped silicon carbide, arsenic doped silicon, silicon fluoride, or fluorine doped silicon.

7. The method of claim 2, wherein the first dopant suppression layer and the second dopant suppression layer are a carbon-containing layer having a carbon atomic concentration (at. %) in a range between about 0.1 at. % and about 3 at. %.

8. The method of claim 2, wherein the first dopant suppression layer is formed of a material that is chemically different from the second dopant suppression layer.

9. A method of forming a semiconductor device structure, comprising:
    forming a plurality of fin structures over a substrate, wherein each fin structure comprises a plurality of first and second semiconductor layers alternatingly arranged, and each of the plurality of first semiconductor layers has a first dopant suppression layer formed therein;
    forming a plurality of sacrificial gate structures over a portion of each of the plurality of fin structures;
    removing portions of the plurality of fin structures not covered by the sacrificial gate structures;
    forming a source/drain feature in regions created as a result of removal of the portions of the fin structures;
    forming sequentially a contact etch stop layer (CESL) and an interlayer dielectric on the source/drain feature;
    removing the sacrificial gate structure and the plurality of second semiconductor layers to expose a portion of the plurality of first dopant suppression layers; and
    forming sequentially a gate dielectric layer and a gate electrode layer on exposed portions of the plurality of the first dopant suppression layers.

10. The method of claim 9, wherein the first dopant suppression layer is a carbon doped silicon or a doped silicon carbide.

11. The method of claim 10, wherein the carbon doped silicon has a carbon atomic concentration (at. %) in a range between about 0.1 at. % and about 3 at. %.

12. The method of claim 10, wherein the first dopant suppression layer is a arsenic doped silicon carbide.

13. The method of claim 12, wherein the doped silicon carbide has a dopant concentration of about $1 \times 10^{18}$ atoms per cubic centimeter (atoms/cm$^3$) or less.

14. The method of claim 9, further comprising:
    prior to forming a source/drain feature, forming a second dopant suppression layer on exposed portions of the plurality of first semiconductor layers and the first dopant suppression layers.

15. The method of claim 14, wherein the second dopant suppression layer is formed of the same material as the first dopant suppression layer.

16. The method of claim 14, wherein the second dopant suppression layer is formed of a material that is chemically different than that of the first dopant suppression layer.

17. A method of forming a semiconductor device structure, comprising:
    forming a plurality of first semiconductor layers over a substrate;
    forming a plurality of first dopant suppression layers over the substrate, wherein the first dopant suppression layers are chemically different from the first semiconductor layers, and at least two adjacent first dopant suppression layers are formed between two adjacent first semiconductor layers;
    forming a plurality of second semiconductor layers over the substrate, wherein the second semiconductor layers are chemically different from the first semiconductor layers and the first dopant suppression layers, and each second semiconductor layer is disposed between and in contact with two adjacent first dopant suppression layers;
    forming trenches through the plurality of first semiconductor layers, the plurality of first dopant suppression layers, and the plurality of second semiconductor layers to expose a portion of the substrate;
    forming a plurality of sacrificial gate structures over a portion of the plurality of first semiconductor layers, the plurality of first dopant suppression layers, and the plurality of second semiconductor layers;
    removing portions of the plurality of first semiconductor layers, the plurality of first dopant suppression layers, and the plurality of second semiconductor layers not covered by the sacrificial gate structures;
    removing edge portions of each of the plurality of second semiconductor layers to create a cavity between two adjacent first dopant suppression layers;
    filling the cavity with a dielectric spacer;
    forming a source/drain feature on opposing sides of each of the plurality of the sacrificial gate structures so that the source/drain feature is at least in contact with the dielectric spacers and the first dopant suppression layers;
    forming sequentially a contact etch stop layer (CESL) and an interlayer dielectric on the source/drain feature;
    removing the sacrificial gate structure and the plurality of second semiconductor layers to form an opening between two adjacent first suppression layers; and
    filling the opening with a gate dielectric layer and a gate electrode layer so that the gate dielectric layer is in contact with the first suppression layers, the dielectric spacers, and the gate electrode layer.

18. The method of claim 17, wherein each of the first dopant suppression layers is formed with a first thickness, each of the first semiconductor layers is formed with a second thickness greater than the first thickness, and each of the second semiconductor layers is formed with a third thickness greater than the first thickness.

19. The method of claim 17, further comprising:
    prior to forming a source/drain feature, forming a second dopant suppression layer on exposed portions of the plurality of first semiconductor layers.

20. The method of claim 19, wherein the first and second dopant suppression layers comprise silicon carbide, carbon doped silicon, silicon carbonitride, arsenic doped silicon carbide, arsenic doped silicon, or fluorine doped silicon.

* * * * *